United States Patent
Ayranci et al.

(10) Patent No.: US 12,424,986 B2
(45) Date of Patent: Sep. 23, 2025

(54) EXTENDED IMPEDANCE MATCHING WIDEBAND LNA ARCHITECTURES

(71) Applicant: Murata Manufacturing Co., Ltd., Nagaokakyo-Shi (JP)

(72) Inventors: Emre Ayranci, Costa Mesa, CA (US); Mengsheng Rui, San Diego, CA (US); Miles Sanner, San Diego, CA (US); Steve Gao, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 559 days.

(21) Appl. No.: 17/855,386

(22) Filed: Jun. 30, 2022

(65) Prior Publication Data
US 2024/0007058 A1    Jan. 4, 2024

(51) Int. Cl.
*H03F 1/56*    (2006.01)
*H03F 3/195*   (2006.01)
*H03H 7/00*    (2006.01)

(52) U.S. Cl.
CPC ............ *H03F 1/565* (2013.01); *H03F 3/195* (2013.01); *H03H 7/00* (2013.01);
(Continued)

(58) Field of Classification Search
CPC .......... H03F 1/565; H03F 1/223; H03F 3/195; H03F 3/245; H03F 2200/222;
(Continued)

(56) References Cited

U.S. PATENT DOCUMENTS

| | | | |
|---|---|---|---|
| 4,940,949 A * | 7/1990 | Landi | H03F 1/22 330/262 |
| 7,646,252 B2 * | 1/2010 | Banba | H03F 1/565 330/311 |

(Continued)

FOREIGN PATENT DOCUMENTS

| | | |
|---|---|---|
| JP | 2005-175819 | 6/2005 |
| KR | 10-0882103 | 2/2009 |
| KR | 10-2016-0069376 | 6/2016 |

OTHER PUBLICATIONS

Ayranci, et al., "Wideband Multi-Gain LNA Architecture", U.S. patent application filed Jun. 2, 2021, U.S. Appl. No. 17/337,227, 45 pgs.
(Continued)

*Primary Examiner* — Andrea Lindgren Baltzell
*Assistant Examiner* — Nareh Shamiryan
(74) *Attorney, Agent, or Firm* — Steinfl + Bruno LLP

(57) ABSTRACT

Circuits and methods for an amplifier (particularly LNAs) that achieve wideband output impedance matching and high gain while simultaneously rejecting out-of-band (OOB) harmonic frequencies. Some embodiments allow multiple modes of operation to allow selection of gain versus linearity characteristics. One aspect of the present invention is improvement of the linearity and sensitivity of a whole RF "front end" (RFFE) receiver chain by suppressing OOB gain within an LNA component at higher order harmonic frequencies. Another aspect of the present invention are new wideband and ultra-wideband LNA load circuits that, while achieving high frequency OOB rejection, maintain in-band high gain and wideband output impedance matching at the same time. Yet another aspect of the present invention are new ultra-wideband LNA output impedance matching circuits.

16 Claims, 17 Drawing Sheets

(52) U.S. Cl.
CPC .. *H03F 2200/222* (2013.01); *H03F 2200/294* (2013.01); *H03F 2200/387* (2013.01); *H03F 2200/451* (2013.01)

(58) Field of Classification Search
CPC ......... H03F 2200/294; H03F 2200/387; H03F 2200/451; H03F 2200/391; H03H 7/00; H03H 7/1766; H03H 7/1775; H03H 7/38
USPC .................................................. 330/277, 311
See application file for complete search history.

(56) References Cited

U.S. PATENT DOCUMENTS

| | | | |
|---|---|---|---|
| 8,081,033 B2 * | 12/2011 | Kim | ........................ H03F 3/72 330/311 |
| 2015/0002236 A1 | 1/2015 | Wang et al. | |
| 2019/0165753 A1 | 5/2019 | Arigong et al. | |

OTHER PUBLICATIONS

Lee, Kang Ha, International Search Report and Written Opinion received from KIPO dated Oct. 6, 2023 for appln. No. PCT/US2023/025318, 11 pgs.

* cited by examiner

EXTENDED IMPEDANCE MATCHING WIDEBAND LNA ARCHITECTURES

BACKGROUND

(1) Technical Field

The invention relates to electronic circuits, and more particularly to radio frequency amplifier circuits.

(2) Background

Many modern electronic systems include radio frequency (RF) receivers; examples include cellular telephones, personal computers, tablet computers, wireless network components, televisions, cable system "set top" boxes, and radar systems. Many RF receivers are paired with RF transmitters in the form of transceivers, which often are quite complex two-way radios. In some cases, RF transceivers are capable of transmitting and receiving across multiple frequencies in multiple bands.

Amplifiers are a common component in RF transmitters, receivers, and transceivers, and are frequently used for power amplification of transmitted RF signals and for low-noise amplification of received RF signals. For many RF systems, particularly those requiring low power and/or portability (e.g., cellular telephones, WiFi-connected computers, cameras, and other devices), it has become common to use complementary metal-oxide semiconductor (CMOS) fabrication technology to create low cost, low power integrated circuits (ICs). CMOS devices include bulk CMOS, silicon-on-insulator (SOI) CMOS, and silicon-on-sapphire (SOS) CMOS (SOS being a type of SOI fabrication technology).

FIG. 1 is a simplified schematic diagram of a generalized embodiment of a prior art low-noise amplifier (LNA) circuit 100. In the illustrated example, the LNA circuit 100 includes an amplifier block 102 comprising a stack of two series-connected FETs $M_{CS}$, $M_{CG}$ in a cascode arrangement. An RF input signal applied to an RF input terminal $RF_{IN}$ may be passed through an input impedance matching circuit 104 and coupled to the gate of the common-source lower FET $M_{CS}$. The source of lower FET $M_{CS}$ is typically connected through a degeneration inductor $L_{DEG}$ to a reference potential, such as circuit ground.

The source of the common-gate upper FET $M_{CG}$ is connected to the drain of lower FET $M_{CS}$. The drain of upper FET $M_{CG}$ provides an amplified RF output signal through a DC blocking capacitor C to an RF output terminal $RF_{OUT}$. Capacitor C may also aid in providing output impedance matching. An inductor L is connected between a source voltage $V_{DD}$ and the drain of upper FET $M_{CG}$ to aid in providing impedance matching and to provide a bias feed to the amplifier block 102. In the illustrated example, the RF output terminal $RF_{OUT}$ is shown coupled to a typical load, represented as a resistor $R_L$. The value of $R_L$ is typically 50 ohms for many modern RF circuits.

A bias circuit 106 is configured to provide a suitable bias voltage $CG\_V_{BIAS}$ to the common-gate upper FET $M_{CG}$ and a suitable bias voltage $CS\_V_{BIAS}$ to the common-source lower FET $M_{CS}$, in known fashion. Additional well-known circuit elements that might be included in some applications, such as bypass capacitors, are omitted for clarity.

Important desired characteristics of an LNA are high gain with low noise, a wide bandwidth, good linearity, and good output impedance matching. Accordingly, four important design parameters for LNAs are gain, noise figure (NF), input-referenced third intercept point (IIP3), and output reflection coefficient. NF is a measure of degradation of the signal-to-noise ratio (SNR) caused by components in a signal chain, with lower values indicating better performance. IIP3 is a figure of merit representing amplifier linearity, with higher values indicating better performance. In general, NF has a stricter specification requirement in high-gain modes than in low gain-modes, while IIP3 has a stricter specification requirement in low-gain modes than in high-gain modes. The output reflection coefficient is the $S_{22}$ scattering parameter (or "S-parameter") and is an indication of output impedance matching, with lower (more negative, when evaluated logarithmically) numbers indicating better impedance matching.

Increases in the frequency of RF communications bands and channels, as well as a continuing increase in the number of bands and channels in use, has pushed current LNA architectures to their limits. For example, achieving stringent requirements for gain, percentage bandwidth, linearity, and output impedance matching with a traditional LNA architecture is not possible for some of the new 5G mobile network bands, particularly in the 3 to 6 GHz NR bands, the upcoming 7-24 GHz bands, and the millimeter wave range (e.g., 24.25 GHz to 52.6 GHz).

For instance, in the LNA architecture shown in FIG. 1, output impedance matching is through a single-stage LC output impedance matching circuit comprising L and C. However, this single-stage LC architecture has tradeoff limitations, depending on the choice of values for L and C: either narrowband output impedance matching at high gain, or wider-band output impedance matching at lower gain (e.g., by reducing the Q-factor of the LC architecture). A further limitation of the illustrated architecture is that it has essentially no high frequency out-of-band (OOB) rejection since the L and C components form a high-pass filter.

One way to overcome some of the limitations mentioned above of the circuit shown in FIG. 1 is to add a low-pass LC filter to achieve wideband matching and some high frequency OOB rejection. For example, FIG. 2 is a simplified schematic diagram of a generalized embodiment of a prior art LNA circuit 200 having a two-stage LC output impedance matching circuit 202. Similar in most aspects to the LNA circuit 100 of FIG. 1, the LNA circuit 200 of FIG. 2 includes a two-stage LC output impedance matching circuit 202 that adds a second inductor L' coupled between the $RF_{OUT}$ terminal and the first capacitor C, and a second capacitor C' connected between $V_{DD}$ and a node between C and L'. The added LC elements comprise a low-pass filter. While having a wider-band output impedance matching characteristic compared to the LNA circuit 100 of FIG. 1, the resulting LNA circuit 200 still does not achieve the high gain required for 5G mobile network bands and other high-frequency applications. Further, the increased circuitry of the two-stage LC output impedance matching circuit 202 hurts linearity due to power loss in the low-pass LC filter. Compared to single-stage LC output impedance matching, to achieve the same gain, the voltage swing at the drain of common-gate FET $M_{CG}$ must be larger to compensate the loss in two-stage LC output impedance matching, which reduces linearity.

Another possible architecture is to limit OOB frequencies by inserting a bandpass filter between the source of the $RF_{IN}$ signal (e.g., an antenna) and the LNA input, but this reduces gain and noise figure, thus degrading the sensitivity of the receiver.

Accordingly, there is a need for an LNA architecture that overcomes these limitations of conventional LNA architectures.

SUMMARY

The present invention encompasses circuits and methods for an LNA that achieves wideband output impedance matching and high gain while simultaneously rejecting OOB harmonic frequencies. Some embodiments allow multiple modes of operation to allow selection of gain versus linearity characteristics. The inventive circuits and methods may also be applied to other types of amplifiers, such as power amplifiers.

One aspect of the present invention is improvement of the linearity and sensitivity of a whole RF "front end" (RFFE) receiver chain by suppressing out-of-band gain within an LNA component at higher order harmonic frequencies (such as $2^{nd}$, $3^{rd}$, and higher order harmonic frequencies). Otherwise, these higher-order OOB harmonic frequencies can be down-converted by post-LNA circuitry and degrade receiver performance.

Another aspect of the present invention are new wideband and ultra-wideband LNA load circuits that, while achieving high frequency OOB rejection, maintain in-band high gain and wideband output impedance matching at the same time.

Yet another aspect of the present invention are new ultra-wideband LNA output impedance matching circuits.

Some embodiments include a load circuit configured to be coupled between a radio frequency amplifier core and an output terminal, the load circuit including: a first LC resonator coupled between the radio frequency amplifier core and a node, the first LC resonator including a first inductor and a first capacitor coupled in parallel; a matching and bias circuit coupled to the node and configured to be coupled to a power supply, the matching and bias circuit including a second inductor and a second capacitor coupled in parallel; and a second LC resonator coupled between the node and the output terminal, the second LC resonator including a capacitor coupled to the output terminal, and a third inductor and a third capacitor being coupled in parallel with each other and in series with the capacitor.

Some embodiments include a load circuit configured to be coupled between a radio frequency amplifier core and an output terminal, the load circuit including: a first inductor coupled between the radio frequency amplifier core and a node; a first resistor coupled in parallel with the first inductor between the radio frequency amplifier core and the node; a second inductor coupled to the node and configured to be coupled to a power supply; a second resistor coupled in parallel with the second inductor and coupled to the node and configured to be coupled to the power supply; and a capacitor coupled between the node and the output terminal.

Some embodiments include a load circuit configured to be coupled between a radio frequency amplifier core and an output terminal, the load circuit including: a first inductor coupled between the radio frequency amplifier core and a node; a second inductor coupled to the node and configured to be coupled to a power supply; a capacitor coupled between the node and the output terminal; and a feedback circuit coupled between the input terminal and a feedback node in an output signal path of the amplifier core and selectively switchable between enabled and disabled, wherein the feedback circuit includes a capacitor, a resistor, and switch coupled in series.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses circuits and methods for an LNA that achieves wideband output impedance matching and high gain while simultaneously rejecting OOB harmonic frequencies. Some embodiments allow multiple modes of operation to allow selection of gain versus linearity characteristics. The inventive circuits and methods may also be applied to other types of amplifiers, such as power amplifiers.

General Concepts

One aspect of the present invention is improvement of the linearity and sensitivity of a whole RF "front end" (RFFE) receiver chain by suppressing out-of-band gain within an LNA component at higher order harmonic frequencies (such as $2^{nd}$, $3^{rd}$, and higher order harmonic frequencies). Otherwise, these higher-order OOB harmonic frequencies can be down-converted by post-LNA circuitry and degrade receiver performance.

Another aspect of the present invention are new wideband and ultra-wideband LNA load circuits that, while achieving high frequency OOB rejection, maintain in-band high gain and wideband output impedance matching at the same time.

Yet another aspect of the present invention are new ultra-wideband LNA output impedance matching circuits.

For purposes of this disclosure, "narrowband", "wideband" and "ultra-wideband" may be characterized as a percentage fractional bandwidth equal to (stop frequency $f_{STOP}$ minus start frequency $f_{START}$) divided by the center frequency $f_{CENTER}$ of a band, or $(f_{STOP}-f_{START})/f_{CENTER}$ (expressed as a percentage), where $f_{CENTER}$ $(f_{STOP}+f_{START})/2$. TABLE 1 below shows typical guidelines (not strict definitions) for characterizing typical percentage bandwidths.

TABLE 1

| Nominal Band Name | % bandwidth range |
|---|---|
| Narrowband | <7.5% |
| Extended Narrowband | 7.5%~15% |
| Wideband | 15%~25% |
| Ultra-wideband | >25% |

TABLE 2 below provides examples of common cellular telephone bands and their characterization as wideband or ultra-wideband using the guidelines in TABLE 1.

TABLE 2

| Typical Application | $f_{START}$ (GHz) | $f_{STOP}$ (GHz) | $f_{CENTER}$ (GHz) | % Bandwidth |
|---|---|---|---|---|
| Wideband (N77) | 3.3 | 4.2 | 3.75 | 24.00% |
| Wideband (N96) | 5.925 | 7.125 | 6.525 | 18.39% |
| Ultra-Wideband (UWB) | 6.2 | 9 | 7.6 | 36.84% |

First Embodiment

Figure 2:
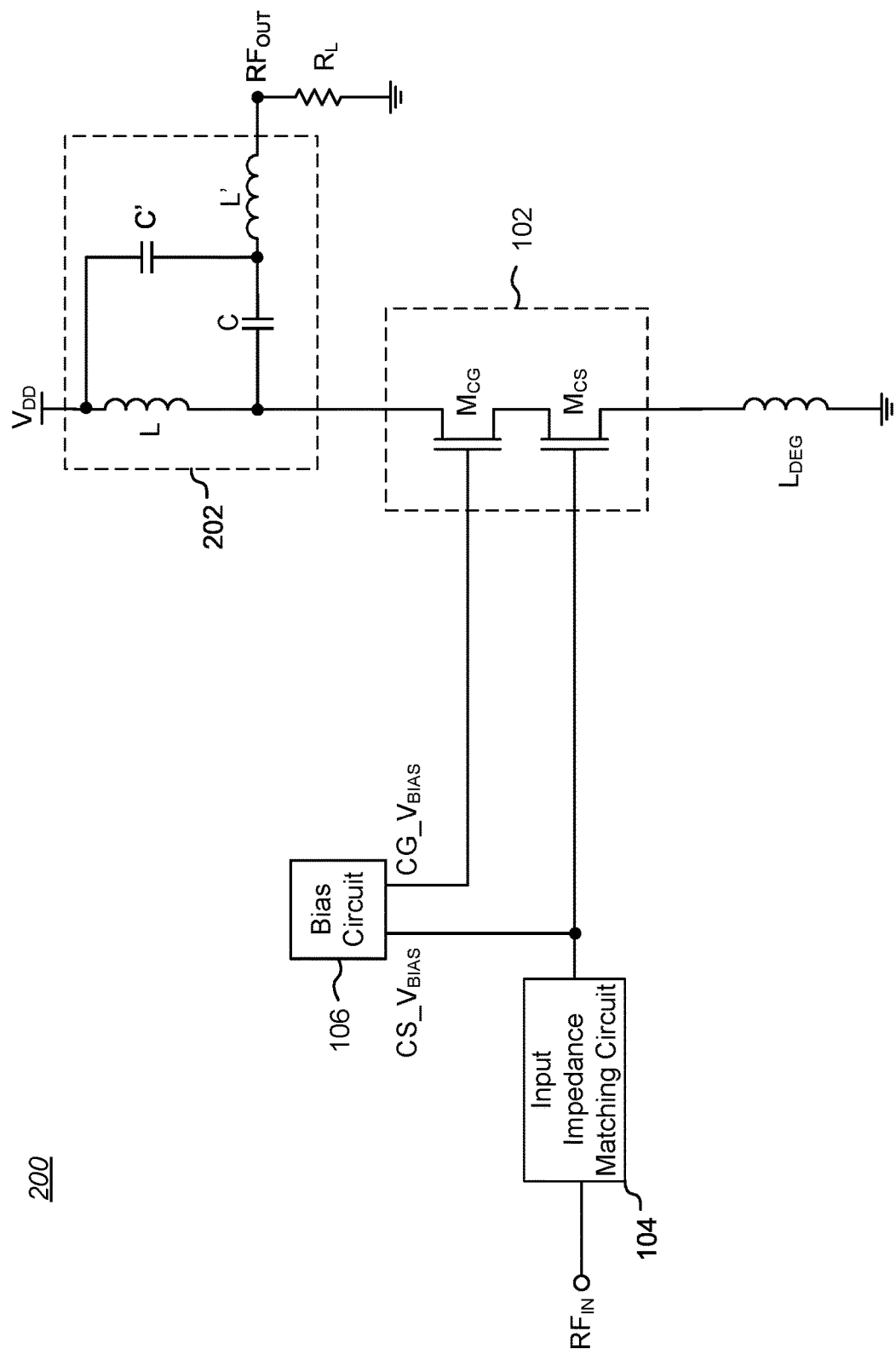
FIG. 2 is a simplified schematic diagram of a generalized embodiment of a prior art LNA circuit having a two-stage LC output impedance matching circuit.
Figure 3A:
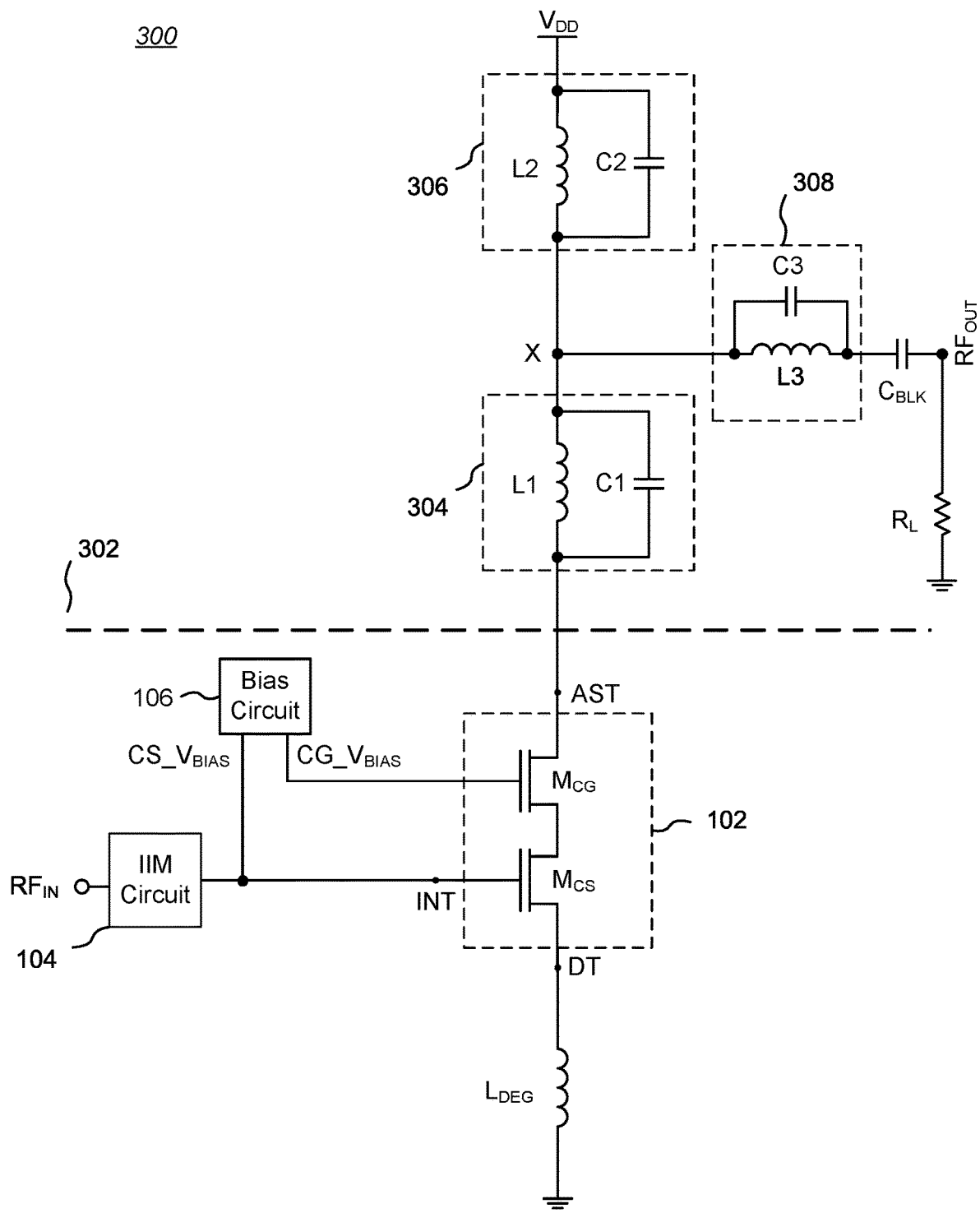
FIG. 3A is a simplified schematic diagram of a first embodiment of a wideband LNA circuit in accordance with the present invention.

FIG. 3A is a simplified schematic diagram of a first embodiment of a wideband LNA circuit 300 in accordance with the present invention. The circuitry below demarcation line 302 may be essentially the same as corresponding circuitry in FIGS. 1 and 2. Accordingly, the LNA circuit 300 includes an amplification core 102 that includes a common-source FET $M_{CS}$ and a common-gate FET $M_{CG}$ in a cascode configuration. The gate of the common-source FET $M_{CS}$ may be regarded as an input terminal INT of the amplification core 102, the source of the common-source FET $M_{CS}$ may be regarded as a degeneration terminal DT of the amplification core 102, and the drain of the common-gate FET $M_{CG}$ may be regarded as an amplified-signal terminal AST of the amplification core 102. Also included below demarcation line 302 are an input impedance matching circuit 104, a bias circuit 106, and a degeneration inductor $L_{DEG}$ coupled to a reference potential.

Figure 4:
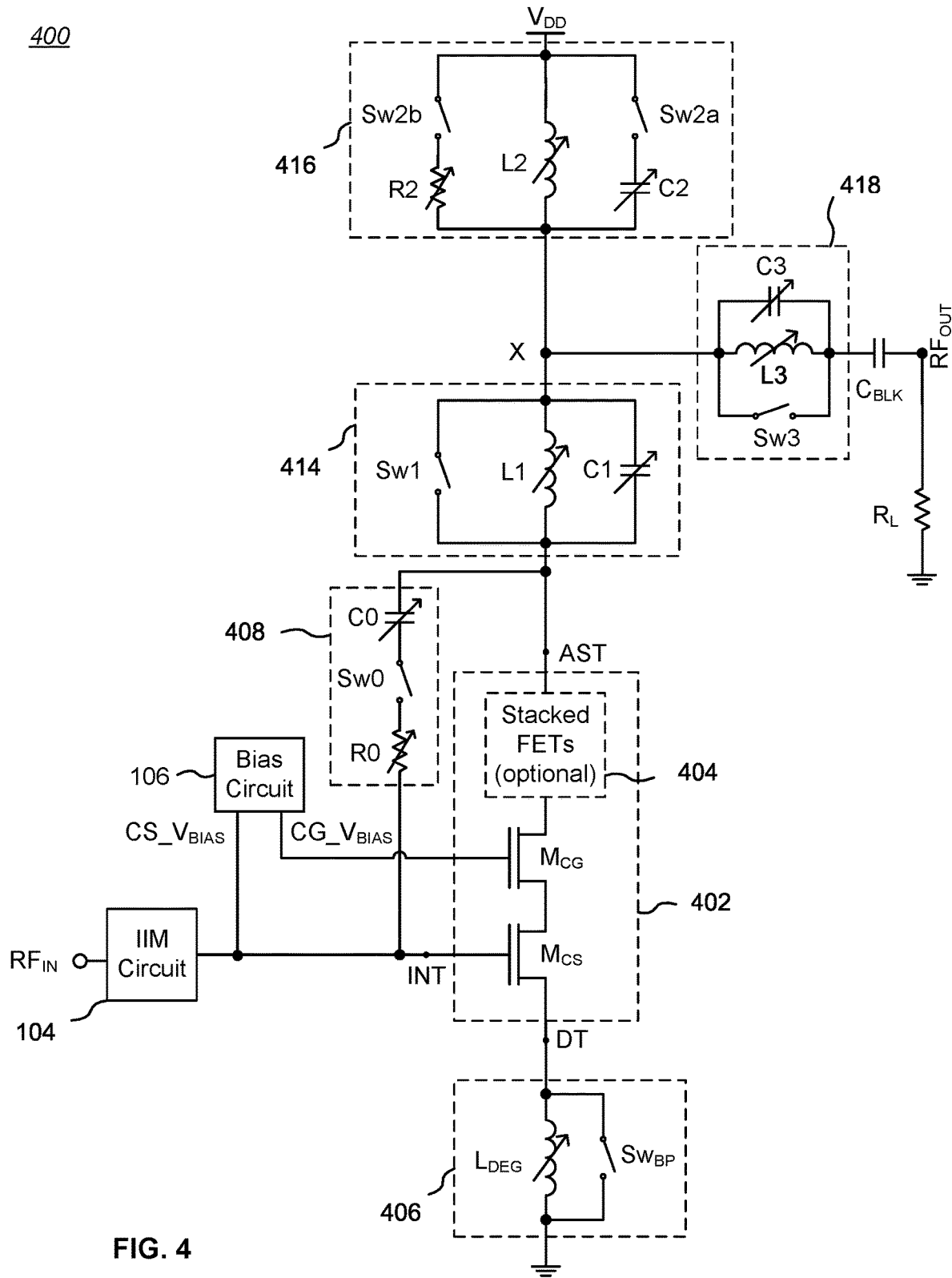
FIG. 4 is a simplified schematic diagram of a second embodiment of a wideband LNA circuit in accordance with the present invention.

Although the amplification core 102 is shown in FIG. 3A with only a pair of series-coupled FET devices, additional FET devices may be included. For example, in some embodiments, in order to overcome a relatively low breakdown voltage per CMOS FET, multiple common-gate FETS may be series-coupled in a FET stack between the drain of the bottom-most common-gate FET $M_{CG}$ and the amplified-signal terminal AST—that is, the amplification core 102 may have multiple series-coupled common-gate FETs in a cascode configuration. An example of such a configuration is shown in FIG. 4 described below.

Above demarcation line 302 is an improved load circuit that includes a first LC resonator 304 coupled between the amplified-signal terminal AST of the amplification core 102 and a node X, a matching and bias circuit 306 coupled between a power supply $V_{DD}$ and node X, and a second LC resonator 308 coupled between node X and the $RF_{OUT}$ output terminal. In the illustrated example, the RF output terminal $RF_{OUT}$ is shown coupled to a typical load, represented as a resistor $R_L$.

The first LC resonator 304 includes an inductor L1 and a capacitor C1 coupled in parallel and between node X and the amplified-signal terminal AST. The matching and bias circuit 306 includes an inductor L2 and a capacitor C2 coupled in parallel and between $V_{DD}$ and node X. The second LC resonator 308 includes an inductor L3 and a capacitor C3 coupled in parallel and between node X and a DC blocking capacitor $C_{BLK}$, which in turn is coupled to $RF_{OUT}$. In alternative embodiments, $C_{BLK}$ may be positioned between node X and the second LC resonator 308. Note that the capacitor $C_{BLK}$, being a DC blocking capacitor, is not essential to the wideband performance the invention supports. Rather, capacitor $C_{BLK}$ or an equivalent is generally needed since L1 and L3 would otherwise form a DC path from the amplifier block 102 to $RF_{OUT}$. However, in some embodiments, capacitor $C_{BLK}$ may not be needed if the DC loss into resistor $R_L$ is acceptable, or if the circuitry connected at $RF_{OUT}$ includes a DC blocking capacitor or an equivalent.

In integrated circuit embodiments, C1, C2, and C3 may be implemented partly as the parasitic capacitor of their respective on-chip inductors L1, L2, L3 due to the finite self-resonant frequency (SRF) of the inductors.

Of note, C2 and L3 form a low-loss low-pass filter (LPF), while L1 and C1 in the first LC resonator 304, and L3 and C3 in the second LC resonator 308, respectively function as low-loss band-stop filters.

Figure 1:
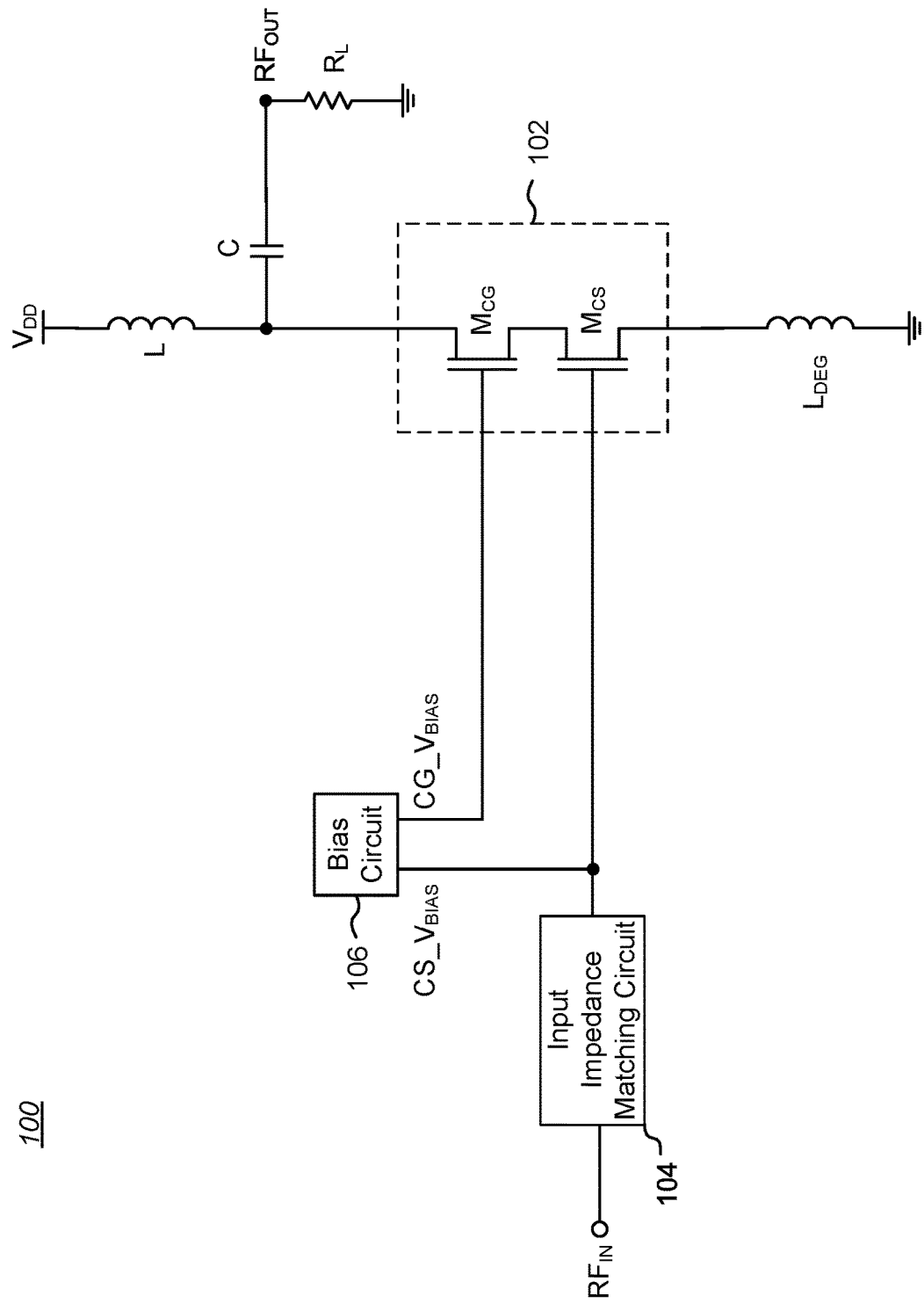
FIG. 1 is a simplified schematic diagram of a generalized embodiment of a prior art low-noise amplifier (LNA) circuit.

At a frequency of interest (e.g., fo=3.75 GHz), the combination of L1, L2, C2, and L3 form a second-order output impedance matching circuit that achieves wider bandwidth than the circuits of FIGS. 1 and 2. This topology also shows higher gain due to the series peaking effects of inductors L1 and L3, which increases the load impedance presented at the AST node.

The improved load circuit achieves high OOB rejection of at least the second through fifth harmonic frequencies (2fo, 3fo, 4fo, and 5fo) as follows:
  In the first LC resonator 304, L1 and C1 create a very high impedance (close to an "open" circuit) in the signal path to achieve OOB rejection at ~2fo;
  The LPF formed by C2 and L3 improves OOB rejection at 3fo and 4fo; and In the second LC resonator 308, L3 and C3 improves OOB rejection at ~5fo.

Figure 3B:
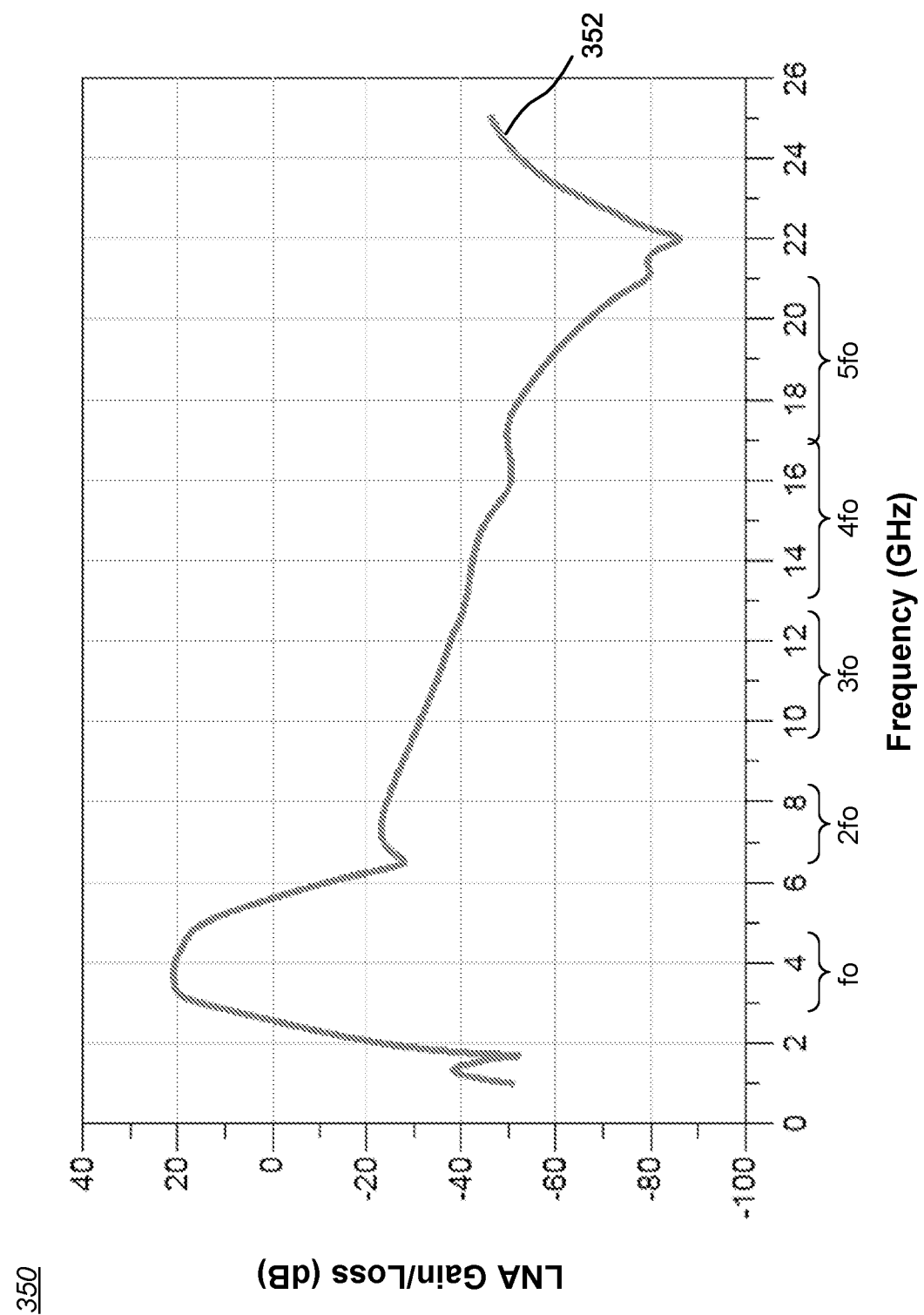
FIG. 3B is a graph showing one example of LNA gain/loss as a function of frequency for a modeled implementation of the LNA circuit shown in FIG. 3A.

FIG. 3B is a graph 350 showing one example of LNA gain/loss as a function of frequency for a modeled implementation of the LNA circuit shown in FIG. 3A. The modeled circuit used the inductance and capacitance values shown in TABLE 3 below and a value of about 3.75 GHz for fo.

TABLE 3

| Implementation Example | | |
|---|---|---|
| L1 | 5 nH | SRF = 7.1 GHZ |
| C1 | 100 fF | |
| L2 | 2.4 nH | SRF = 3.4 GHz |
| C2 | 920 fF | |
| L3 | 1.9 nH | SRF = 23.1 GHz |
| C3 | 25 fF | |

Referring to graph line 352, the combination of L1, L2, C2 and L3 impedance matches the LNA output $RF_{OUT}$ to the load $R_L$ (e.g., 50 ohms), and provide high gain at the frequency of interest, fo. L1 and C1 resonate at about 2fo, thus suppressing that OOB harmonic frequency; the location of the corresponding dip can be adjusted by changing the value of C1. C2 and L3 improve OOB rejection at 3fo and 4fo; C2 will particularly impact the OOB gain at 3fo and 4fo (the larger C2 is, the more gain, but larger C2 values may reduce in-band gain flatness). L3 and C3 resonate at about 5fo, thus suppressing that OOB harmonic frequency.

Figure 3C:
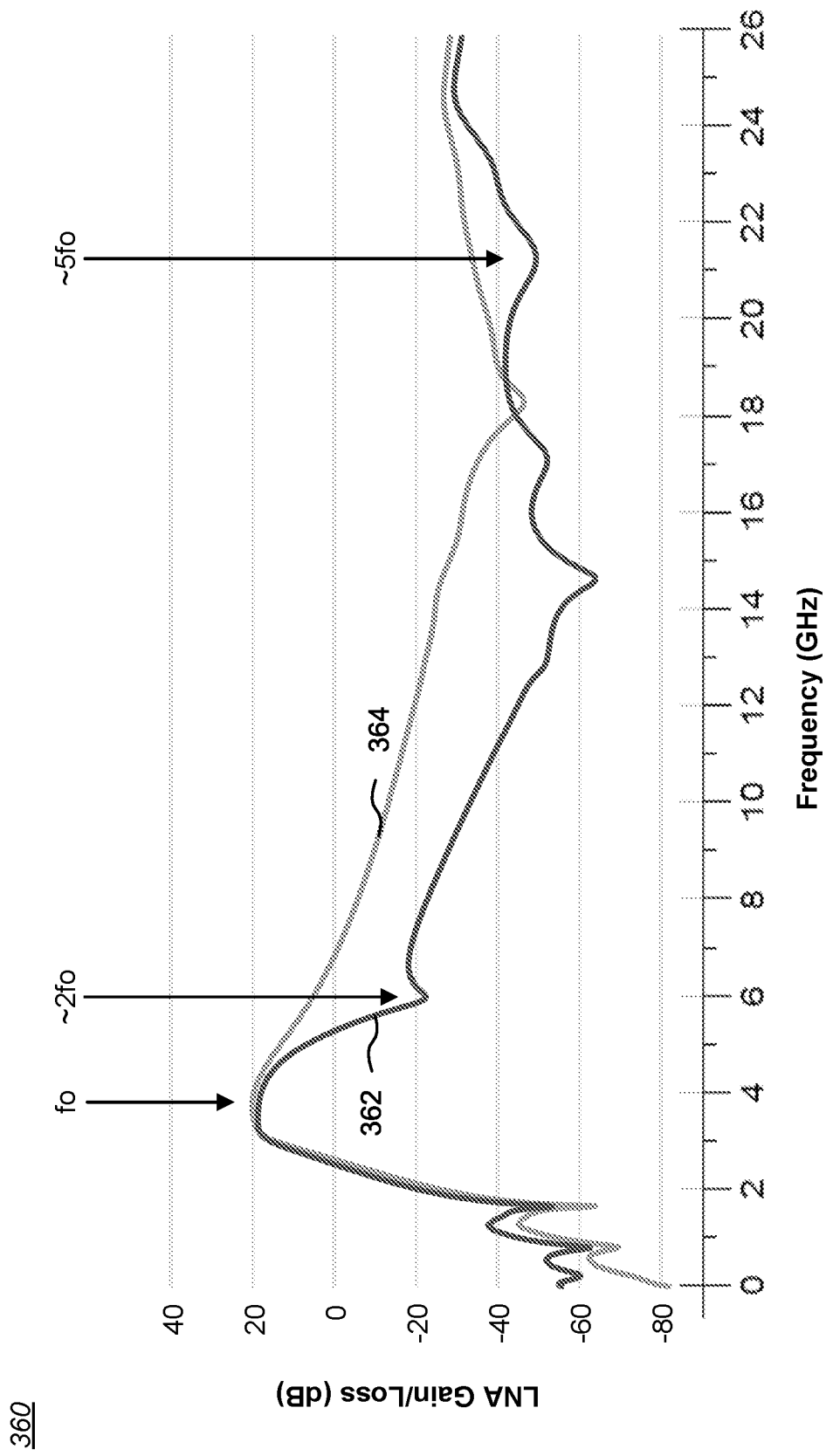
FIG. 3C is a graph comparing LNA gain/loss as a function of frequency for a modeled implementation of the LNA circuit shown in FIG. 3A versus a modeled conventional wideband LNA.

FIG. 3C is a graph 360 comparing LNA gain/loss as a function of frequency for a modeled implementation of the LNA circuit shown in FIG. 3A versus a modeled conventional wideband LNA. Graph line 362 shows gain/loss for the modeled implementation of the LNA circuit shown in FIG. 3A, while graph line 364 shows gain/loss for the modeled conventional wideband LNA, such as the LNA circuit 100 of FIG. 1 (note that the LC component values used to generate FIG. 3C differ from the LC component values used to generate FIG. 3B, and hence the harmonic frequencies occur at different points). As the comparison shows, the modeled implementation of the LNA circuit shown in FIG. 3A exhibits much better rejection of OOB harmonic frequencies while achieving wideband high gain at fo.

Second Embodiment

FIG. 4 is a simplified schematic diagram of a second embodiment of a wideband LNA circuit 400 in accordance with the present invention. The illustrated embodiment shows the addition of a number of switches and other components that provide flexibility in programmatically adapting the LNA circuit 400 for operation in a number of different modes that allow tradeoffs between gain, bandwidth, and linearity.

The LNA circuit 400 includes an amplification core 402 that includes a common-source FET $M_{CS}$ and a common-gate FET $M_{CG}$ in a cascode configuration. Accordingly, the gate of the common-source FET $M_{CS}$ may be regarded as an input terminal INT of the amplification core 402, the source of the common-source FET $M_{CS}$ may be regarded as a degeneration terminal DT of the amplification core 402, and the drain of the common-gate FET $M_{CG}$ may be regarded as an amplified-signal terminal AST of the amplification core 402. In some embodiments, in order to overcome a relatively low breakdown voltage per CMOS FET, multiple common-gate FETS may be series-coupled in a FET stack 404 between the drain of the bottom-most common-gate FET $M_{CG}$ and the amplified-signal terminal AST—that is, the amplification core 402 may have multiple series-coupled common-gate FETs in a cascode configuration. The amplified-signal terminal AST would then be the drain of the upper-most common-gate FET in the amplification core 402.

The degeneration terminal DT is typically coupled thorough a degeneration circuit 406 to a reference potential, such as circuit ground. In some embodiments, the degeneration circuit 406 may comprise an adjustable degeneration inductor $L_{DEG}$, such as a multiport integrated circuit inductor coil. An adjustable degeneration inductor $L_{DEG}$ may be used to improve linearity in low gain modes. For example, a smaller value for the degeneration inductor $L_{DEG}$ may be used in a higher gain modes, and a larger value for the degeneration inductor $L_{DEG}$ may be used in a lower gain modes. Some embodiments of the degeneration circuit 406 may include a bypass switch $Sw_{BP}$ coupled in parallel with the degeneration inductor $L_{DEG}$.

An RF input signal applied to an RF input terminal $RF_{IN}$ may be passed through an input impedance matching circuit 104 and coupled to the gate of the common-source lower FET $M_{CS}$. A bias circuit 106 is configured to provide a suitable bias voltage $CG\_V_{BIAS}$ to the common-gate FET $M_{CG}$ and a suitable bias voltage $CS\_V_{BIAS}$ to the common-source FET $M_{CS}$, as described above.

Some embodiments may include an input matching feedback circuit 408. The feedback circuit 408 is shown coupled between the input terminal INT and the amplified-signal terminal AST. More generally, the input matching feedback circuit 408 may be coupled to a feedback node in the output signal path of the amplification core 402, which may be the drain of any of the FETS in the amplification core 402. The choice of feedback node for connection to the input matching feedback circuit 408 may be made, for example, based on different desired feedback strength and different desired input impedance.

The input matching feedback circuit 408 in the illustrated embodiment comprises a DC blocking capacitor C0 series-coupled with a switch Sw0, which in turn is series-coupled to a resistor R0. In some embodiments, C0 and/or R0 may be adjustable, as shown, or have fixed values. In alternative embodiments, the input matching feedback circuit 408 may include one or more parallel switches $Sw0_1 \ldots Sw0_n$ (generically, $Sw0_x$), which in turn are series-coupled to respective parallel resistor(s) $R0_1 \ldots R0_n$ (generically, $R0_x$). With n parallel switch/resistor branches, the tunability of the resistors $R0_x$ is equal to $2^n$ (the total number of switching combinations). Note that the values of the resistors $R0_x$ need not be identical. The input matching feedback circuit 408 may be disabled by opening all feedback switches $Sw0_x$.

Capacitor C0, the set of one or more switches $Sw0_x$, and the set of one or more resistors $R0_x$ may be connected in any series order in alternative embodiments. In alternative embodiments, a single switch Sw0 may be used in combination with an adjustable or fixed resistor R0. In still other embodiments, the switch Sw0 may be omitted, thereby permanently coupling the set of one or more resistors $R0_x$ between the input terminal INT and a feedback node in the output signal path of the amplification core 402.

In various gain modes, the in-circuit presence of one or more resistors $R0_x$ allows the Q-factor of the input impedance matching to be reduced, which increases the bandwidth of the enhanced LNA circuit 400 at the expense of gain and NF.

An advantage of using a variable or multi-state input matching feedback circuit 408 is that multiple resistance values enable multiple gain modes. For instance, LNAs in mobile RF receiver devices need multiple gain modes depending upon the range of input signal strength at the receiver. In addition, enabling multiple gain modes by using variable or multi-state feedback resistors $R0_x$ may eliminate the need for an output attenuator (common in conventional receiver LNAs).

Further information regarding the input matching feedback circuit 408 may be found in U.S. patent application Ser. No. 17/337,227, filed Jun. 2, 2021, entitled "Wideband Multi Gain LNA Architecture", assigned to the assignee of the present invention, the contents of which are hereby incorporated by reference.

The LNA circuit 400 includes a modified improved load circuit that includes a modified first LC resonator 414 coupled between the amplified-signal terminal AST of the amplification core 402 and a node X, a modified matching and bias circuit 416 coupled between a power supply $V_{DD}$ and node X, and a modified second LC resonator 418 coupled between node X and the $RF_{OUT}$ output terminal. In the illustrated example, the RF output terminal $RF_{OUT}$ is shown coupled to a typical load, represented as a resistor $R_L$.

The modified first LC resonator 414 includes an inductor L1, a capacitor C1, and an added switch Sw1 coupled in parallel and between node X and the amplified-signal terminal AST. Either or both of L1 and C1 may be adjustable components, as shown, or have fixed values. The switch Sw1 allows bypassing L1 and C1, for example, under programmatic control or when setting performance characteristics of the LNA circuit 400 (e.g., at the time of manufacture or of inclusion in a larger circuitry or system).

The modified matching and bias circuit 416 includes an inductor L2 coupled between $V_{DD}$ and node X. A capacitor C2 is coupled between $V_{DD}$ and node X (and thus in parallel with L2), optionally through a switch Sw2a. A resistor R2 is coupled between $V_{DD}$ and node X (and thus in parallel with L2), optionally through a switch Sw2b. Any of L2, C2, and/or R2 may be adjustable components, as shown, or have fixed values. The switches Sw2a, Sw2b allows configuring C2 and/or R2 as being selectively enabled or in-circuit (i.e., switch closed), or selectively disabled or out-of-circuit (i.e., switch open). The state of switches Sw2a, Sw2b may be set, for example, under programmatic control or when setting performance characteristics of the LNA circuit 400. When switch Sw2b is set to place R2 in-circuit, or when switch Sw2b is omitted (and thus R2 is permanently in-circuit), then R2 "de-Q's" the inductor L2 (i.e., reduces the Q-factor of inductor L2), thereby reducing gain but increasing bandwidth. Tunability for resistor R2 enables variable gain reduction, with smaller resistance providing wider bandwidth by further "de-Q'ing" inductor L2. Tunability for capacitor C2 enables better output impedance matching in low gain modes.

The modified second LC resonator 418 includes an inductor L3, a capacitor C3, and a switch Sw3 coupled in parallel and between node X and a DC blocking capacitor $C_{BLK}$, which in turn is coupled to $RF_{OUT}$. Either of both of L3 and C3 may be adjustable components, as shown, or have fixed values. Switch Sw3 allows bypassing L3 and C3, for example, under programmatic control or when setting performance characteristics of the LNA circuit 400.

As described above, C2 and L3 form a low-loss low-pass filter (LPF), while L1 and C1 in the modified first LC resonator 414, and L3 and C3 in the modified second LC resonator 418, respectively function as low-loss band-stop filters. In integrated circuit embodiments, C1, C2, and C3 may be implemented partly as the parasitic capacitor of their respective on-chip inductors L1, L2, L3 due to the finite self-resonant frequency (SRF) of the inductors.

The architecture shown by way of example in FIG. 4 provides programmability that includes switching between various modes of component configurations and component values to tradeoff gain, bandwidth, and linearity while providing wideband output matching and high OOB rejection. For example, in one low gain mode, L1 and C1 are bypassed by closing switch Sw1, and R2 is connected in-circuit in parallel with L2 and C2 by closing switch Sw2b, resulting in a reduction of gain and de-Q'ing of the output network to extend bandwidth. Since there is less loss in the load circuit with L1 and C1 bypassed, to achieve the same gain there will be less voltage swing at the drain of the common-gate upper FET $M_{CG}$, which leads to better linearity. As described above, wideband output impedance matching is achieved by the LC network formed by C2 and L3, which also work as a low-pass filter to achieve OOB rejection even in the example low gain mode. C2 is tunable to achieve better output matching in the example low gain mode.

In one high gain mode, switch Sw1 is opened, placing L1 and C1 in-circuit, and R2 is disconnected by opening switch Sw2b, resulting in an increase of gain and no de-Q'ing of the output network, but somewhat reducing bandwidth.

Other modes of operation may be achieved by selectively opening and closing switches Sw0, Sw1, Sw2a, Sw2b, Sw3, and $Sw_{BP}$ as desired, thus enabling tradeoffs among gain, bandwidth, and linearity by invoking different gain modes. Making some or all of the inductors L1, L2, L3, the capacitors C0, C1, C2, C3, and/or the resistors R0, R2 adjustable—particularly dynamically adjustable, as by programmatic control—further enables tradeoffs among gain, bandwidth, and linearity by invoking different gain modes.

Ultra-Wideband Output Impedance Matching Enhancements

In applications using a stand-alone RFFE configured to connect to other circuitry, such as antenna-located receiver LNAs, the LNA should have good output impedance matching to such other circuitry—typically 50 ohms for many modern RF circuits—over the frequency of operation. In ultra-wideband applications, this design goal is challenging to achieve with high gain.

For a single stage LNA, wideband output impedance matching can be achieved by the LNA architectures described above and by an LNA architecture as described in U.S. patent application Ser. No. 17/337,227, referenced above. To achieve even wider output impedance matching for ultra-wideband LNAs, the Q of the output matching impedance network can be lowered by deQ'ing the inductors of the output network, which results in lower gain but better output impedance matching. One aspect of the present invention is a new LNA architecture that implements a new de-Q'ing technique that lowers the Q of the output impedance matching network while achieving a better gain and bandwidth tradeoff to achieve a required performance for ultra-wideband applications.

Figure 5A:
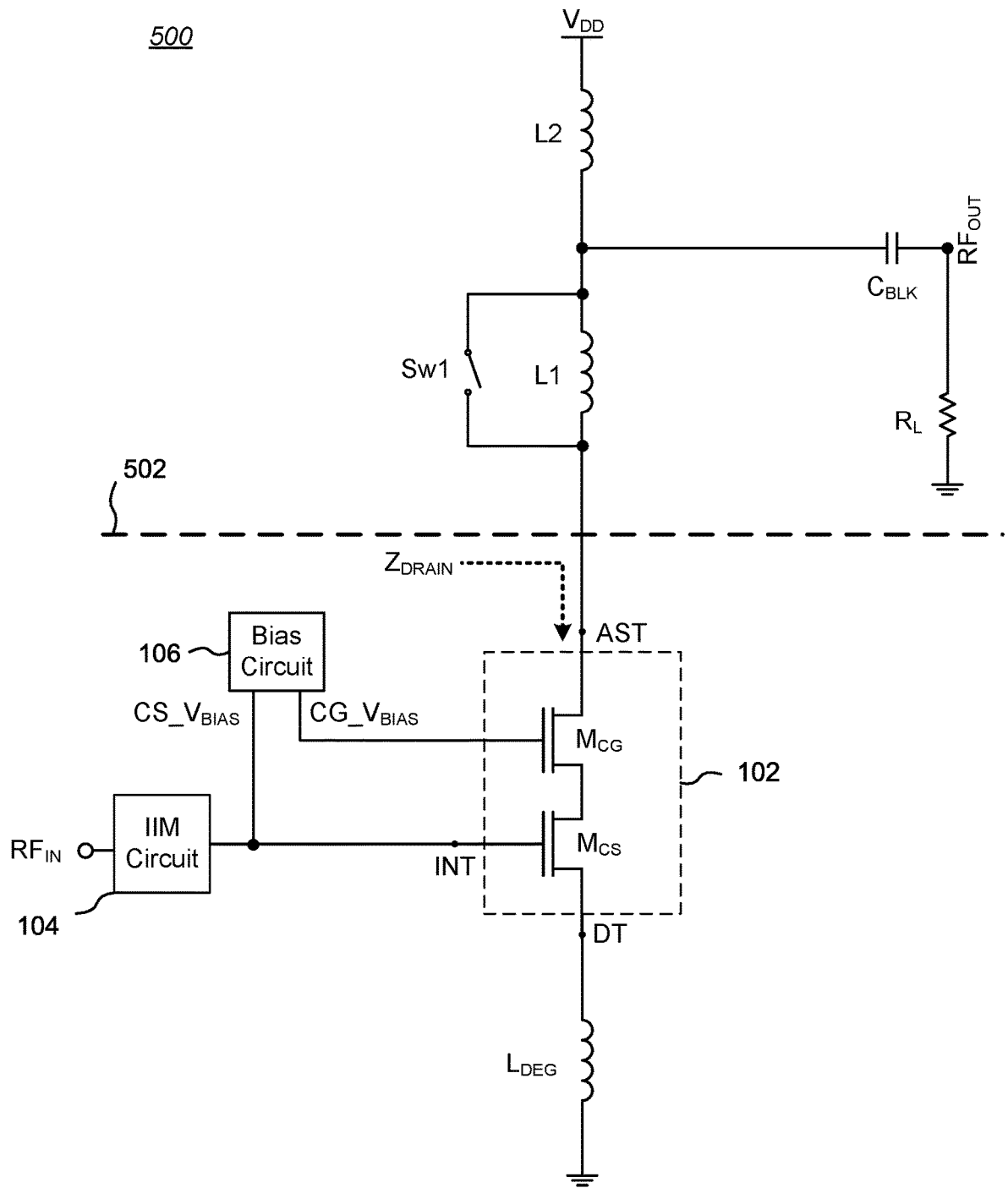
FIG. 5A is a simplified schematic diagram of an LNA circuit having wideband output impedance matching.

A review of a basic wideband LNA architecture may be useful to better understand the design challenge of achieving good output impedance matching. FIG. 5A is a simplified schematic diagram of an LNA circuit 500 having wideband output impedance matching. The circuitry below demarcation line 502 may be essentially the same as corresponding circuitry in FIGS. 1 and 2. The impedance at the drain of the common-gate upper FET $M_{CG}$ of the amplification core 102, $Z_{DRAIN}$, is indicated by a dotted line. Inductors L1 and L2 and DC blocking capacitor $C_{BLK}$ are coupled as shown to a load resistance $R_L$. A bypass switch Sw1 coupled in parallel with L1 allows L1 to be bypassed (out-of-circuit) or connected (in-circuit). Placing inductor L1 in-circuit (i.e., Sw1 set to an OPEN state) extends the bandwidth of the output impedance matching network.

Figure 5B:
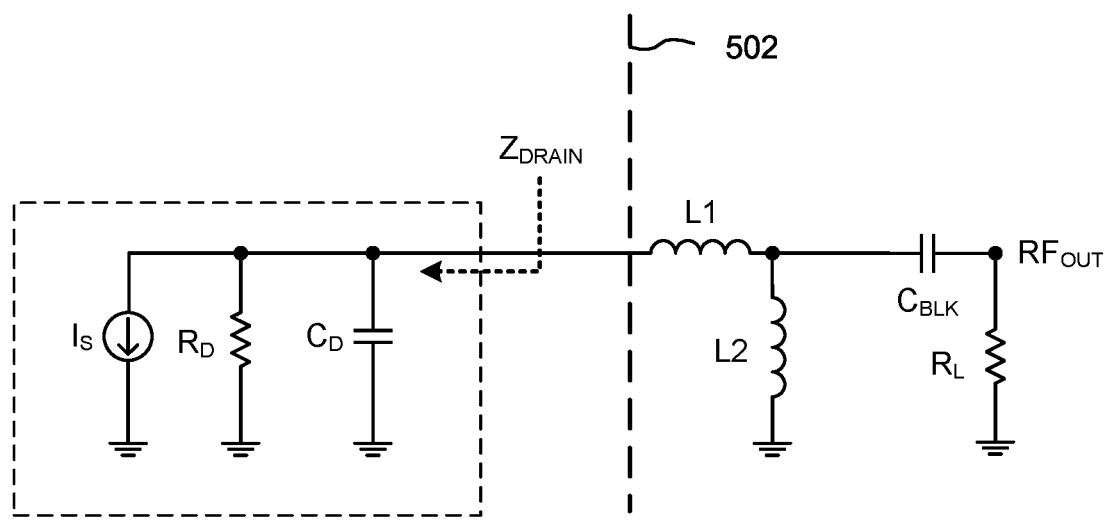
FIG. 5B is a drawing of an equivalent circuit that approximately models the LNA circuit shown in FIG. 5A.

FIG. 5B is a drawing of an equivalent circuit 550 that approximately models the LNA circuit 500 shown in FIG. 5A. The circuitry in FIG. 5A comprising the input impedance matching network 104 and the amplifier block 102 can be approximately modelled as a current source Is in parallel with a resistor $R_D$ and a capacitor $C_D$. The impedance of the common-gate upper FET $M_{CG}$ of the amplification core 102, $Z_{DRAIN}$, is indicated by a dotted line; that is, the resistor $R_D$ and capacitor $C_D$ show the same output impedance as the impedance looking into drain of FET $M_{CG}$. The combination of $C_D$, L1, L2 and $C_{BLK}$ forms a second order output impedance matching network for wideband matching. (Inductor L2, while shown in FIG. 5A as being coupled to $V_{DD}$, can be modeled at the frequency of operation as being coupled to circuit ground, as shown in FIG. 5B.)

The transformation Q of the output impedance matching network is proportional to $R_D/R_L$. The higher the transformation Q, the lower the impedance matching bandwidth. Once $R_D$ and $R_L$ are fixed, the impedance matching bandwidth that can be achieved by the architecture shown in FIG. 5A is limited.

For ultra-wideband LNAs, where even wider output matching is required, the present invention encompasses two architectures that may be used alone or in combination.

Figure 6:
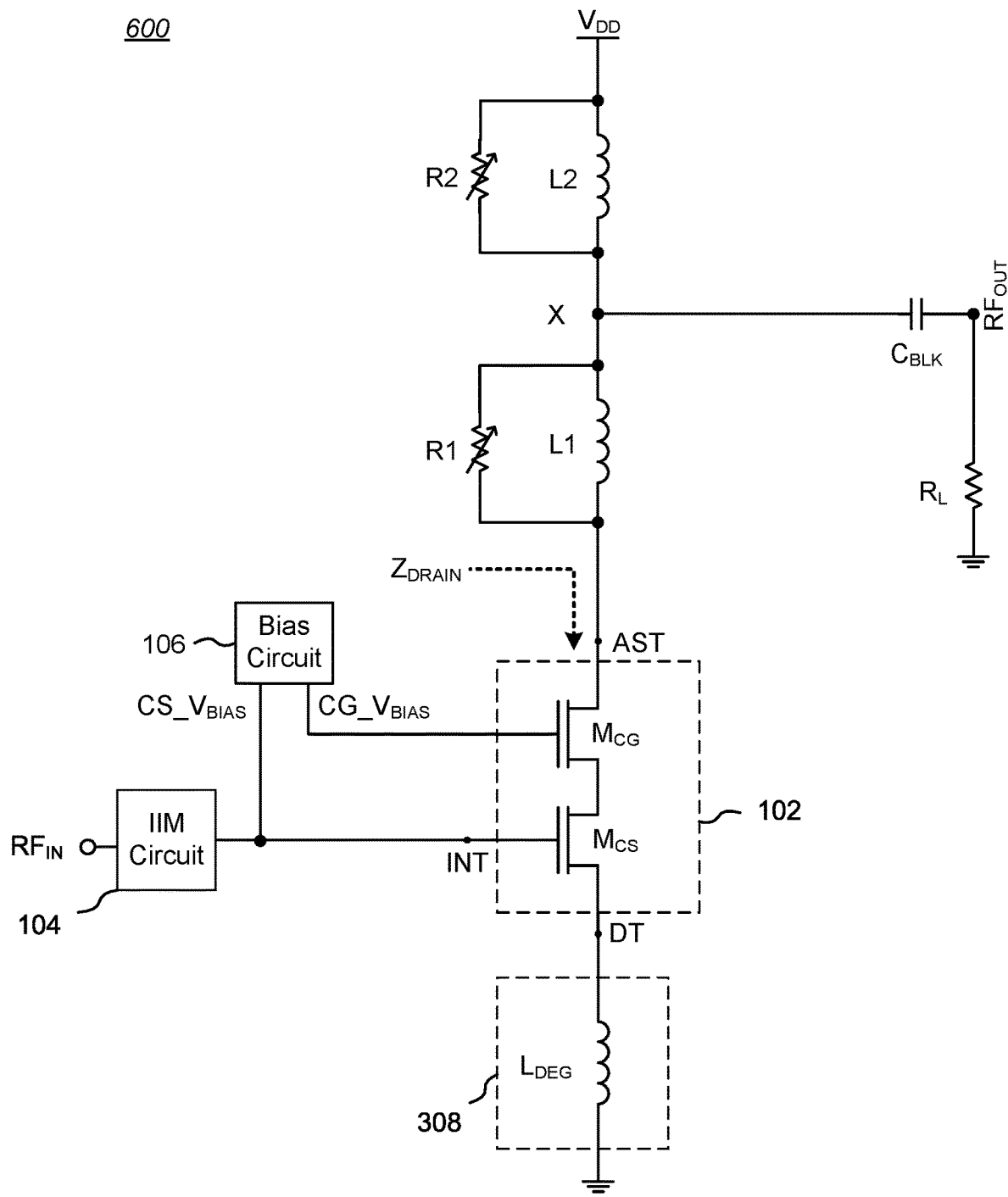
FIG. 6 is a simplified schematic diagram of a first embodiment of an ultra-wideband LNA circuit having enhanced output impedance matching in accordance with the present invention.

FIG. 6 is a simplified schematic diagram of a first embodiment of an ultra-wideband LNA circuit 600 having enhanced output impedance matching in accordance with the present invention. While somewhat similar in part to the circuit shown in FIG. 5A, added elements include a resistor R1 coupled in parallel with inductor L1, and a resistor R2 is coupled in parallel with inductor L2. Resistors R1 and R2 may have fixed values, but may be adjustable, as shown. The values of R1 and R2 may be set under programmatic control or when setting performance characteristics of the LNA circuit 600 (e.g., at the time of manufacture or of inclusion in a larger circuitry or system).

Resistors R1 and R2 function as de-Q'ing resistors to selectively lower the Q of the output impedance matching network and thereby achieve wider bandwidth, with the tradeoff being lower gain.

Figure 7:
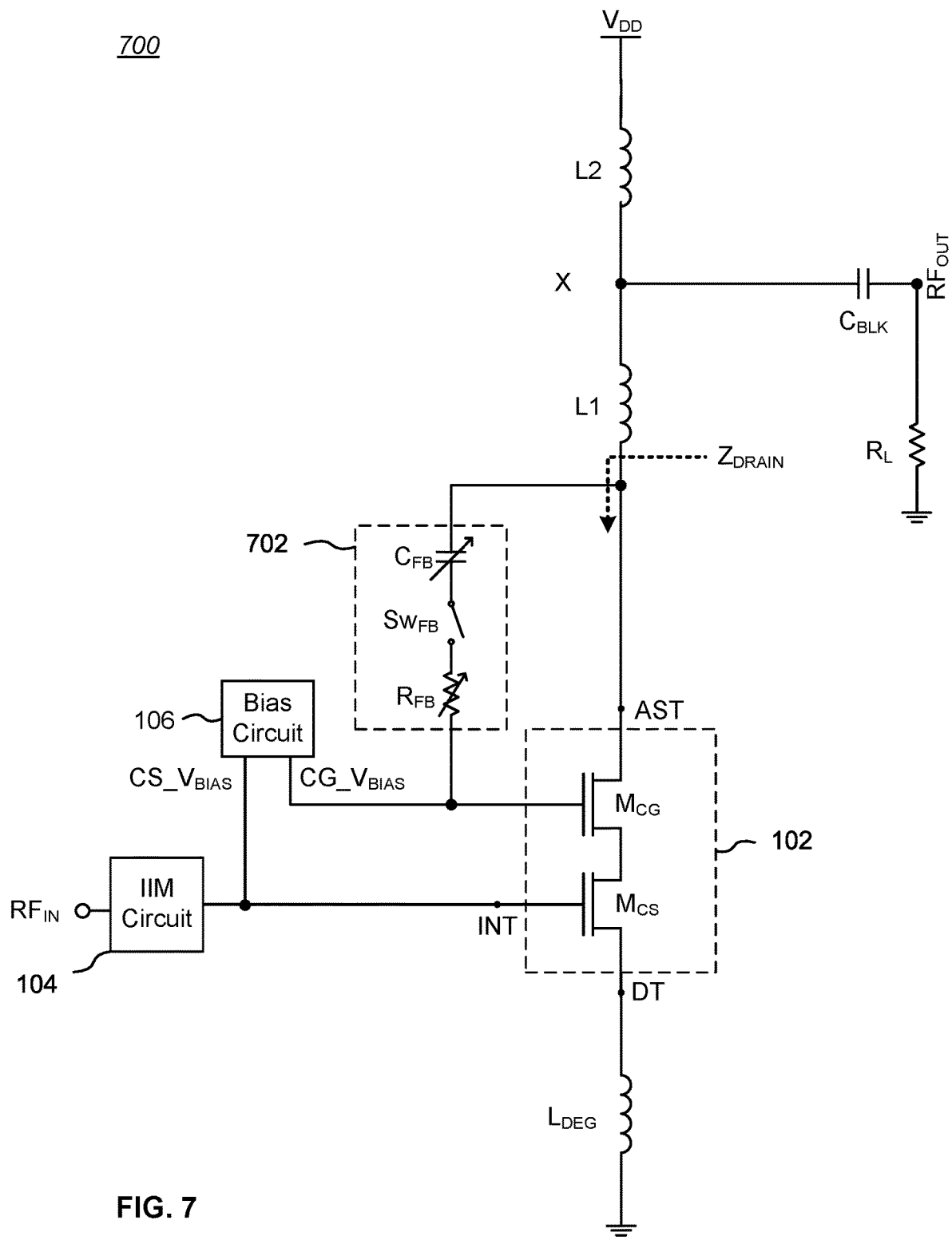
FIG. 7 is a simplified schematic diagram of a second embodiment of an ultra-wideband LNA circuit having enhanced output impedance matching in accordance with the present invention.

In an alternative architecture, instead of lowering the Q inside the output impedance matching network as in the circuit of FIG. 6, a resistor may be added in parallel to the equivalent resistance $R_D$ to lower the transformation Q of the output impedance matching network. For example, FIG. 7 is a simplified schematic diagram of a second embodiment of an ultra-wideband LNA circuit 700 having enhanced output impedance matching in accordance with the present invention. While somewhat similar to the circuit shown in FIG. 5A, added elements include an output matching feedback circuit 702 coupled between the amplified-signal terminal AST and the gate of the common-gate FET $M_{CG}$. The output matching feedback circuit 702 in the illustrated embodiment comprises a capacitor $C_{FB}$ series-coupled to a switch $Sw_{FB}$, which in turn is series-coupled to a resistor $R_{FB}$. In some embodiments, $C_{FB}$ and/or $R_{FB}$ may have fixed values, or may be adjustable, as shown. Capacitor $C_{FB}$, switch $Sw_{FB}$, and resistor $R_{FB}$ may be connected in any series order in alternative embodiments.

Switching $R_{FB}$ in-circuit or out-of-circuit provides two operation modes, a first mode having a wider output impedance matching bandwidth, and a second mode having a narrower output impedance matching bandwidth but with higher gain than the first mode.

When switch $Sw_{FB}$ is CLOSED, $R_{FB}$ couples the amplified-signal terminal AST to the gate of the common-gate FET $M_{CG}$, effectively placing $R_{FB}$ in parallel with $R_D$ in the equivalent circuit (this assumes that there is ultimately an AC path to circuit ground through the $CG\_V_{BIAS}$ line of bias circuit 106). The in-circuit presence of $R_{FB}$ lowers $Z_{DRAIN}$ and reduces the transformation Q the output impedance matching network, where Q is approximately equal to the real part of $Z_{DRAIN}$ divided by $R_L$, or $Re(Z_{DRAIN})/R_L$. Accordingly, the transformation Q is lowered, thereby extending the impedance matching bandwidth of the LNA circuit 700. This architecture shows a better gain and bandwidth tradeoff in a wide variety of applications compared to other known circuits.

Conversely, when switch $Sw_{FB}$ is OPEN, $R_{FB}$ is out-of-circuit with respect to $R_D$ in the equivalent circuit, and the transformation Q the output impedance matching network is not reduced.

Note that integrated circuit embodiments of the circuit shown in FIG. 7 have an advantage over integrated circuit embodiments of the circuit shown in FIG. 6: the output matching feedback circuit 702 that includes $R_{FB}$ results in much less physical routing relative to the inductors L1 and L2, resulting in fewer parasitic inductances and capacitances that might limit bandwidth.

Combinations of Embodiments

Figure 8A:
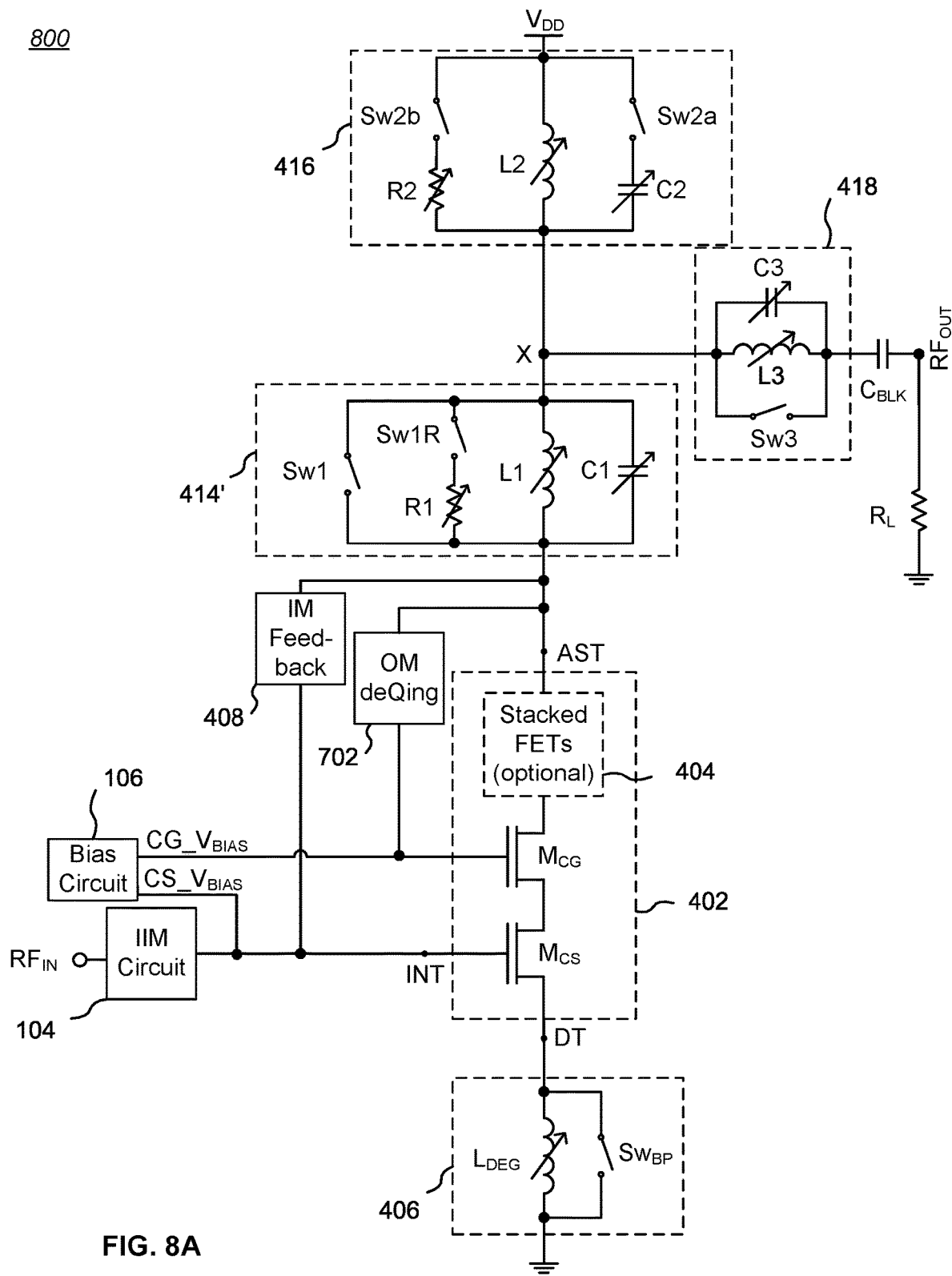
FIG. 8A is a simplified schematic diagram of a first combination embodiment of an ultra-wideband LNA circuit with enhanced output impedance matching in accordance with the present invention.

The inventive circuits described above may be combined in various ways as may be needed for particular applications. For example, FIG. 8A is a simplified schematic diagram of a first combination embodiment of an ultra-wideband LNA circuit 800 with enhanced output impedance matching in accordance with the present invention. Similar in most ways to the LNA circuit 400 of FIG. 4, the illustrated LNA circuit 800 further includes two circuit modifications designed to enhance output impedance matching (note that some embodiments may not include both circuit modifications). The first addition is an output matching feedback circuit 702 (see FIG. 7) coupled between the amplified-signal terminal AST and the gate of the common-gate FET $M_{CG}$. The second addition is a modified first LC resonator circuit 414' that adds a resistor R1 coupled in series with an optional disabling switch Sw1R, with the coupled resistor and switch being coupled in parallel with inductor L1 (see FIG. 6).

Multiple modes of operation may be achieved by selectively opening and closing switches $Sw_{FB}$ (within the output matching feedback circuit 702), Sw0 (within the input matching feedback circuit 408), Sw1, Sw1R, Sw2a, Sw2b, Sw3, and $Sw_{BP}$ as desired, thus enabling tradeoffs among gain, bandwidth, and linearity by invoking different gain modes. Making some or all of the inductors L1, L2, L3, the capacitors $C_{FB}$ (within the output matching feedback circuit 702), C0 (within the input matching feedback circuit 408), C1, C2, C3, and/or the resistors $R_{FB}$ (within the output matching feedback circuit 702), R0 (within the input matching feedback circuit 408), R1, R2 adjustable—particularly dynamically adjustable, as by programmatic control—further enables tradeoffs among gain, bandwidth, and linearity by invoking different gain modes.

Figure 8B:
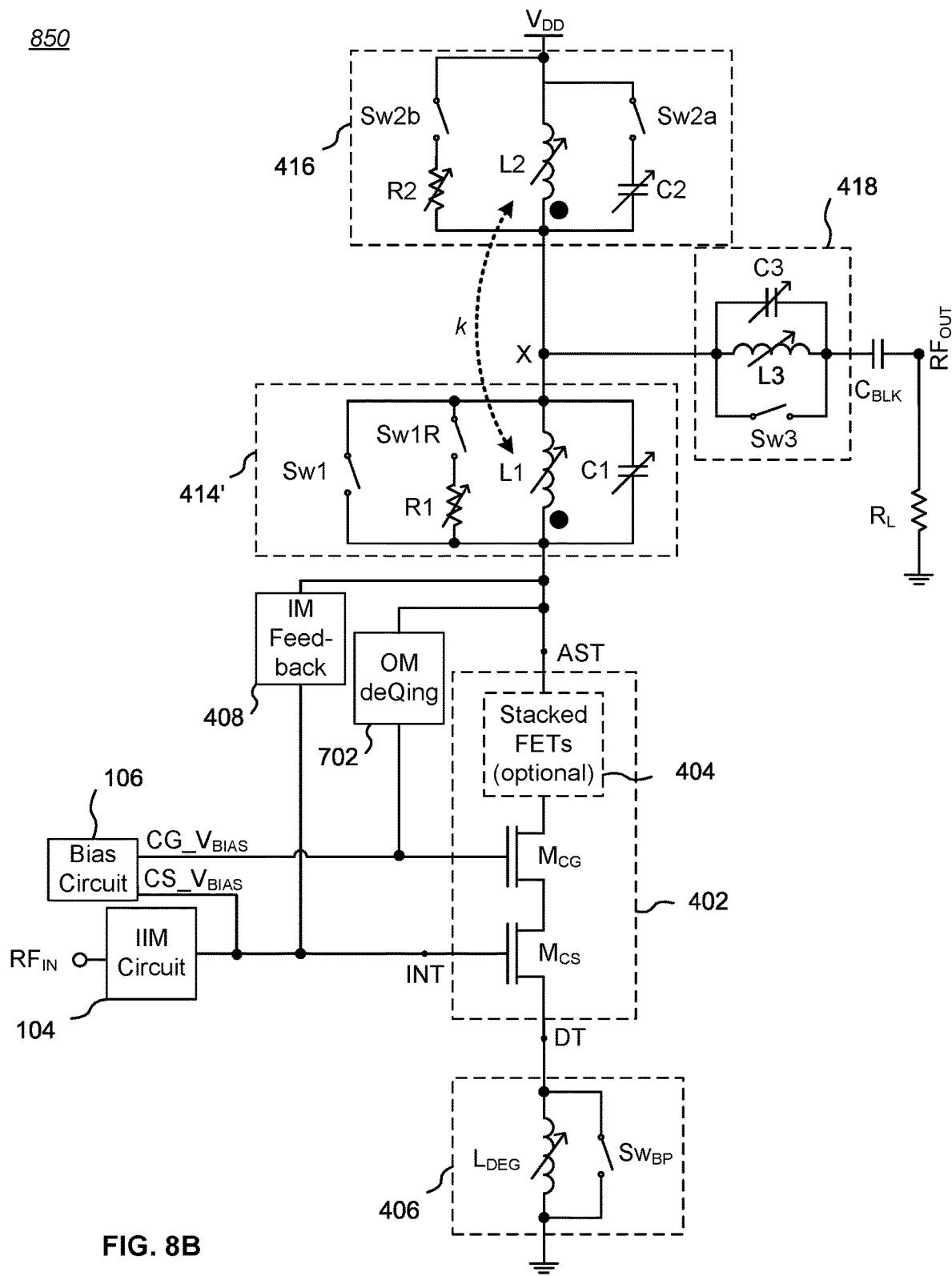
FIG. 8B is a simplified schematic diagram of a second combination embodiment of an ultra-wideband LNA circuit with enhanced output impedance matching in accordance with the present invention

As another example, FIG. 8B is a simplified schematic diagram of a second combination embodiment of an ultra-wideband LNA circuit 850 with enhanced output impedance matching in accordance with the present invention. Similar in most aspects to the embodiment shown in FIG. 8A, the LNA circuit 850 implements inductors L1 and L2 as an asymmetric T-coil, indicated by the dots adjacent L1 and L2 joined by a dotted arrow k. An asymmetric T-coil is an inductive peaking circuit that can extend an amplifier's bandwidth and speed up the output signal rise-time. As is known, an asymmetric T-coil includes series-coupled inductors (equivalent to the discrete inductors L1 and L2) and an inherent bridging capacitance (not shown) across the inductors. Since a T-coil inherently includes a bridging capacitance, the value of the DC blocking capacitor $C_{BLK}$ may need to be adjusted compared to the value of $C_{BLK}$ in the LNA circuit 800 of FIG. 8A.

Integrated circuit implementation of the asymmetric T-coil may be in the form of a three-tap spiral inductor structure, in which a first portion of the spiral (e.g., from an input tap to a mid-tap) corresponds to L1, and a second portion of the spiral (e.g., from the mid-tap to an output tap) corresponds to L2.

An advantage in using an asymmetric T-coil in lieu of discrete inductors L1 and L2 is that IC implementation (e.g., as a three-tap spiral inductor structure) generally saves die area in comparison to discrete inductors.

Input Impedance Matching Circuit

Figure 9:
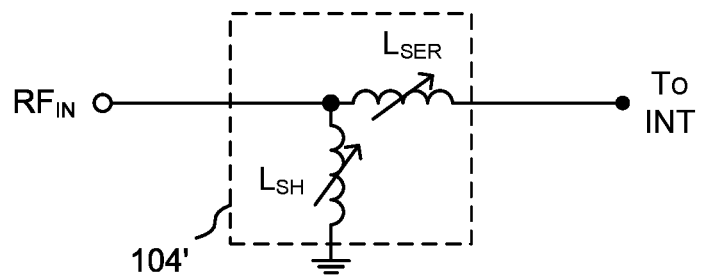
FIG. 9 is a schematic diagram of an enhanced input impedance matching circuit.

The inventive embodiments described above may be further improved by enhancing certain subs-circuits and/or adding additional circuitry. For example, while a number of circuits may be used for the input impedance matching circuit 104 in the various embodiments described above, it may be useful to utilize an enhanced input impedance matching circuit. For example, FIG. 9 is a schematic diagram of an enhanced input impedance matching circuit 104'. The enhanced input impedance matching circuit 104' includes a series inductor $L_{SER}$ coupled between the $RF_{IN}$ terminal and the input terminal INT of the amplification core 102, 402, and a shunt inductor $L_{SH}$ coupled between $L_{SER}$ and a reference potential (e.g., circuit ground). In alternative embodiments, $L_{SH}$ may be connected to $L_{SER}$ on the other side of the $L_{SER}$ rather than on the $RF_{IN}$ terminal side (noting that if the order of connections changes, there may be different input matching bandwidth and noise figure tradeoffs). Either or both of $L_{SER}$ and $L_{SH}$ may be adjustable components, as shown, or have fixed values. In embodiments that include a degeneration circuit 406, the series-shunt inductors $L_{SER}$, $L_{SH}$ of the enhanced input impedance matching circuit 104', together with the common source FET $M_{CS}$ coupled to the degeneration circuit 406, form a doubly-terminated bandpass filter which increases the input bandwidth of an LNA circuit.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 10:
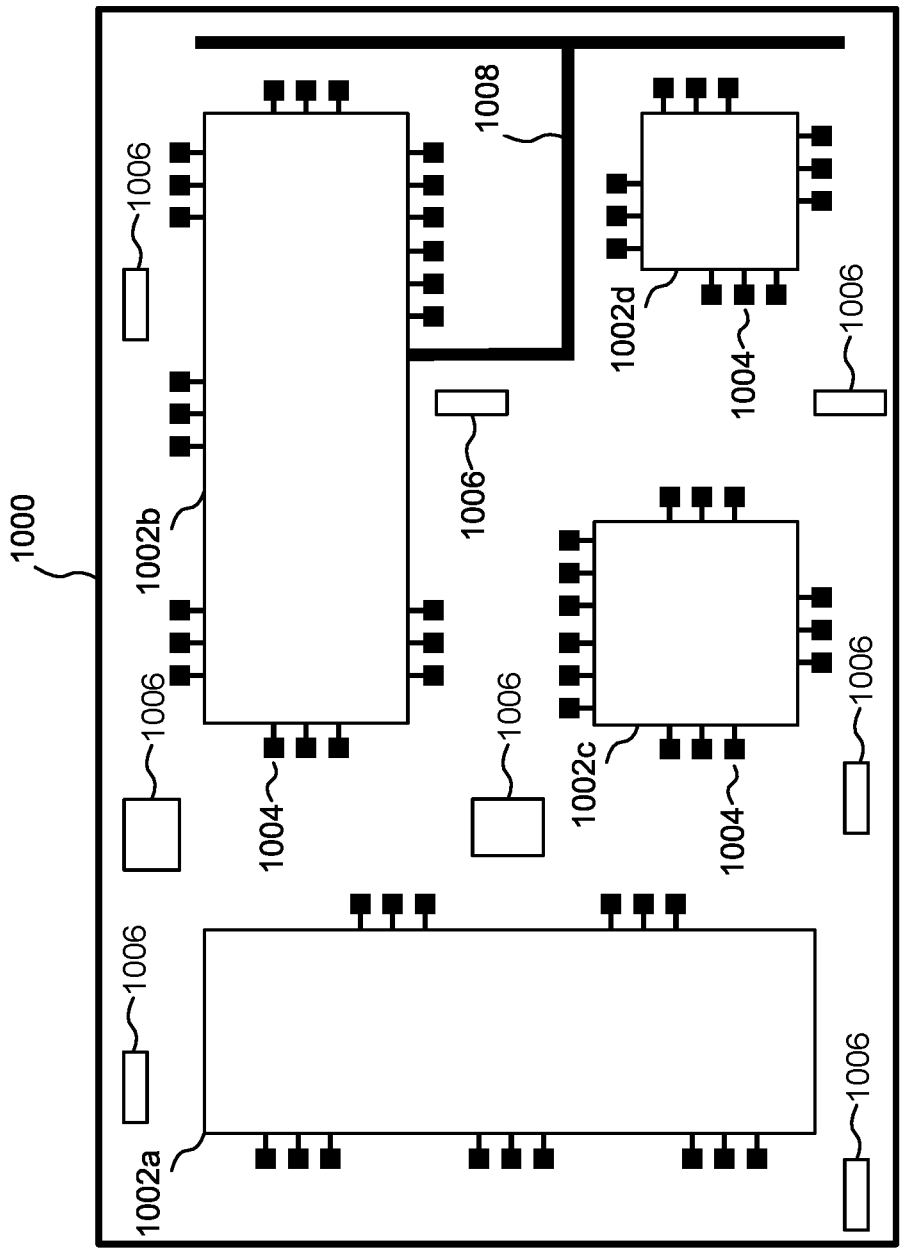
FIG. 10 is a top plan view of a substrate that may be, for example, a printed circuit board or chip module substrate (e.g., a thin-film tile).

As one example of further integration of embodiments of the present invention with other components, FIG. 10 is a top plan view of a substrate 1000 that may be, for example, a printed circuit board or chip module substrate (e.g., a thin-film tile). In the illustrated example, the substrate 1000 includes multiple ICs 1002a-1002d having terminal pads 1004 which would be interconnected by conductive vias and/or traces on and/or within the substrate 1000 or on the opposite (back) surface of the substrate 1000 (to avoid clutter, the surface conductive traces are not shown and not all terminal pads are labelled). The ICs 1002a-1002d may embody, for example, signal switches, active filters, amplifiers (including one or more LNAs), and other circuitry. For example, IC 1002b may incorporate one or more instances of an LNA circuit like the circuits 300, 400, 600, 700, and/or 800 respectively shown in FIGS. 3A, 4, 6, 7, and 8.

The substrate 1000 may also include one or more passive devices 1006 embedded in, formed on, and/or affixed to the substrate 1000. While shown as generic rectangles, the passive devices 1006 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1000 to other passive devices 1006 and/or the individual ICs 1002a-1002d.

The front or back surface of the substrate 1000 may be used as a location for the formation of other structures. For example, one or more antennae may be formed on or affixed to the front or back surface of the substrate 1000; one example of a front-surface antenna 1008 is shown, coupled to an IC die 1002b, which may include RF front-end circuitry. Thus, by including one or more antennae on the substrate 1000, a complete radio may be created.

System Aspects

Embodiments of the present invention are useful in a wide variety of larger radio frequency (RF) circuits and systems, such as radio systems (particularly including cellular radio systems), personal computers, tablet computers, wireless network components, televisions, cable system "set top" boxes, radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 11:
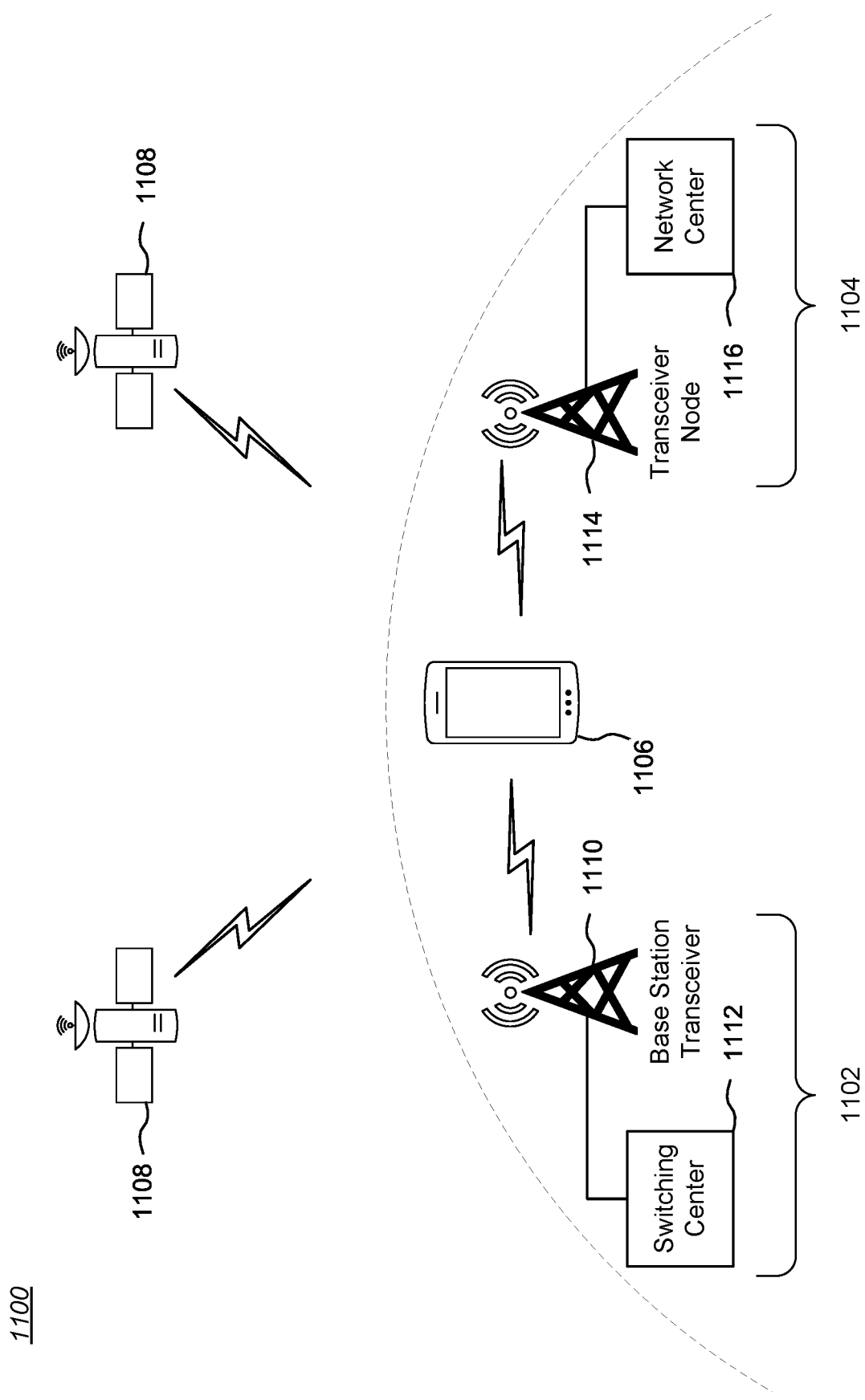
FIG. 11 illustrates an exemplary prior art wireless communication environment comprising different wireless communication systems, and may include one or more mobile wireless devices.

As an example of wireless RF system usage, FIG. 11 illustrates an exemplary prior art wireless communication environment 1100 comprising different wireless communication systems 1102 and 1104, and may include one or more mobile wireless devices 1106.

A wireless device 1106 may be capable of communicating with multiple wireless communication systems 1102, 1104 using one or more of the telecommunication protocols noted above. A wireless device 1106 also may be capable of communicating with one or more satellites 1108, such as navigation satellites (e.g., GPS) and/or telecommunication satellites. The wireless device 1106 may be equipped with multiple antennas, externally and/or internally, for operation on different frequencies and/or to provide diversity against deleterious path effects such as fading and multi-path interference. A wireless device 1106 may be a cellular phone, a personal digital assistant (PDA), a wireless-enabled computer or tablet, or some other wireless communication unit or device. A wireless device 1106 may also be referred to as a mobile station, user equipment, an access terminal, or some other terminology.

The wireless system 1102 may be, for example, a CDMA-based system that includes one or more base station transceivers (BSTs) 1110 and at least one switching center (SC) 1112. Each BST 1110 provides over-the-air RF communication for wireless devices 1106 within its coverage area. The SC 1112 couples to one or more BSTs in the wireless system 1102 and provides coordination and control for those BSTs.

The wireless system 1104 may be, for example, a TDMA-based system that includes one or more transceiver nodes 1114 and a network center (NC) 1116. Each transceiver node 1114 provides over-the-air RF communication for wireless devices 1106 within its coverage area. The NC 1116 couples to one or more transceiver nodes 1114 in the wireless system 1104 and provides coordination and control for those transceiver nodes 1114.

In general, each BST 1110 and transceiver node 1114 is a fixed station that provides communication coverage for wireless devices 1106, and may also be referred to as base stations or some other terminology. The SC 1112 and the NC 1116 are network entities that provide coordination and control for the base stations and may also be referred to by other terminologies.

Figure 12:
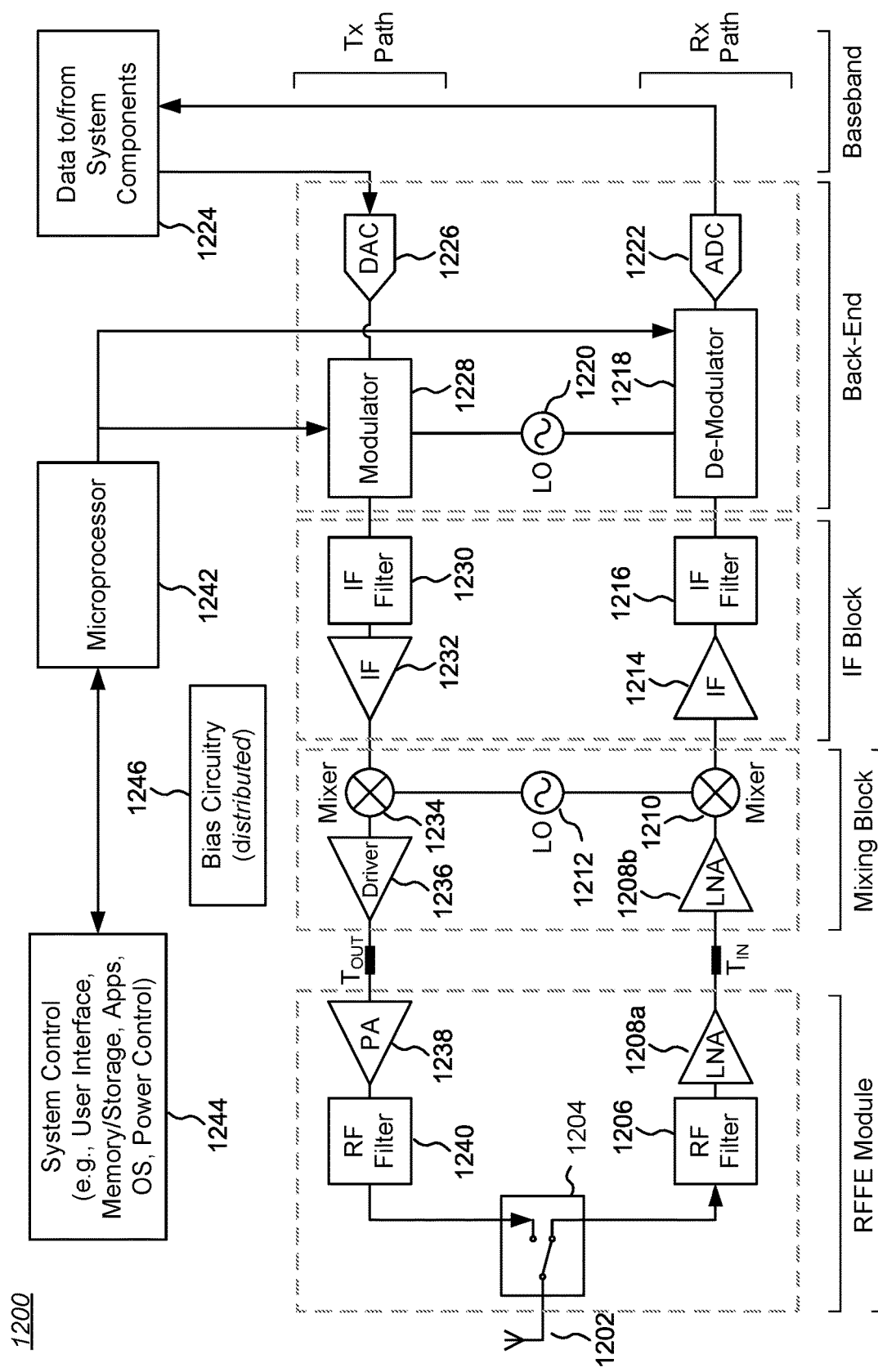
FIG. 12 is a block diagram of a transceiver that might be used in a wireless device, such as a cellular telephone, and which may beneficially incorporate an embodiment of the present invention for improved performance.

An important aspect of any wireless system is in the details of how the component elements of the system perform. FIG. 12 is a block diagram of a transceiver 1200 that might be used in a wireless device, such as a cellular telephone, and which may beneficially incorporate an embodiment of the present invention for improved performance. As illustrated, the transceiver 1200 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, Intermediate Frequency (IF) Block, Back-End, and Baseband sections (noting that in some implementations, the differentiation between sections may be different). The various illustrated sections and circuit elements may be embodied in one die or multiple IC dies. For example, the RF Front End in the illustrated example may include an RFFE module and a Mixing Block, which may be embodied in (or as part of) different IC dies or modules. The different dies and/or modules may be coupled by transmission lines $T_{IN}$ and $T_{OUT}$ (e.g., microstrips, co-planar waveguides, or an equivalent structure or circuit), either or both of which may have, for example, a 50Ω impedance.

The receiver path Rx receives over-the-air RF signals through at least one antenna 1202 and a switching unit 1204, which may be implemented with active switching devices (e.g., field effect transistors or FETs) and/or with passive devices that implement frequency-domain multiplexing, such as a diplexer or duplexer. An RF filter 1206 passes desired received RF signals to at least one low noise amplifier (LNA) 1208a, the output of which is coupled from the RFFE Module to at least one LNA 1208b in the Mixing Block (through transmission line $T_{IN}$ in this example). The LNA(s) 1208b may provide buffering, input matching, and reverse isolation. The output of the LNA(s) 1208b is combined in a corresponding mixer 1210 with the output of a first local oscillator 1212 to produce an IF signal. The IF signal may be amplified by an IF amplifier 1214 and subjected to an IF filter 1216 before being applied to a demodulator 1218, which may be coupled to a second local oscillator 1220. The demodulated output of the demodulator 1218 is transformed to a digital signal by an analog-to-digital converter 1222 and provided to one or more system components 1224 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1224 is transformed to an analog signal by a digital-to-analog converter 1226, the output of which is applied to a modulator 1228, which also may be coupled to the second local oscillator 1220. The modulated output of the modulator 1228 may be subjected to an IF filter 1230 before being amplified by an IF amplifier 1232. The output of the IF amplifier 1232 is then combined in a mixer 1234 with the output of the first local oscillator 1212 to produce an RF signal. The RF signal may be amplified by a driver 1236, the output of which is coupled to a power amplifier (PA) 1238 (through transmission line $T_{OUT}$ in this example). The amplified RF signal may be coupled to an RF filter 1240, the output of which is coupled to at least one antenna 1202 through the switching unit 1204.

The operation of the transceiver 1200 is controlled by a microprocessor 1242 in known fashion, which interacts with system control components 1244 (e.g., user interfaces, memory/storage devices, application programs, operating system software, power control, etc.). In addition, the transceiver 1200 will generally include other circuitry, such as bias circuitry 1246 (which may be distributed throughout the transceiver 1200 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1200 may be positioned in a different order (e.g., filters) or omitted. Other components can be (and often are) added, such as (by way of example only) additional filters, impedance matching networks, variable phase shifters/attenuators, power dividers, etc.

As a person of ordinary skill in the art will understand, an RF system architecture is beneficially impacted by the current invention in critical ways, including enabling selection of a first mode of operation providing high gain with wide output impedance matching with trade-offs with respect to current, NF, and linearity, and a second mode of operation providing wideband output impedance matching with improved NF and linearity at lower current and moderate gain. These system-level improvements are specifically enabled by the current invention and enable embodiments of the invention to meet the strict performance specifications of customers and a number of RF standards. The current invention is therefore critical to embodiments of the overall system shown in FIG. 12.

Methods

Figure 13:
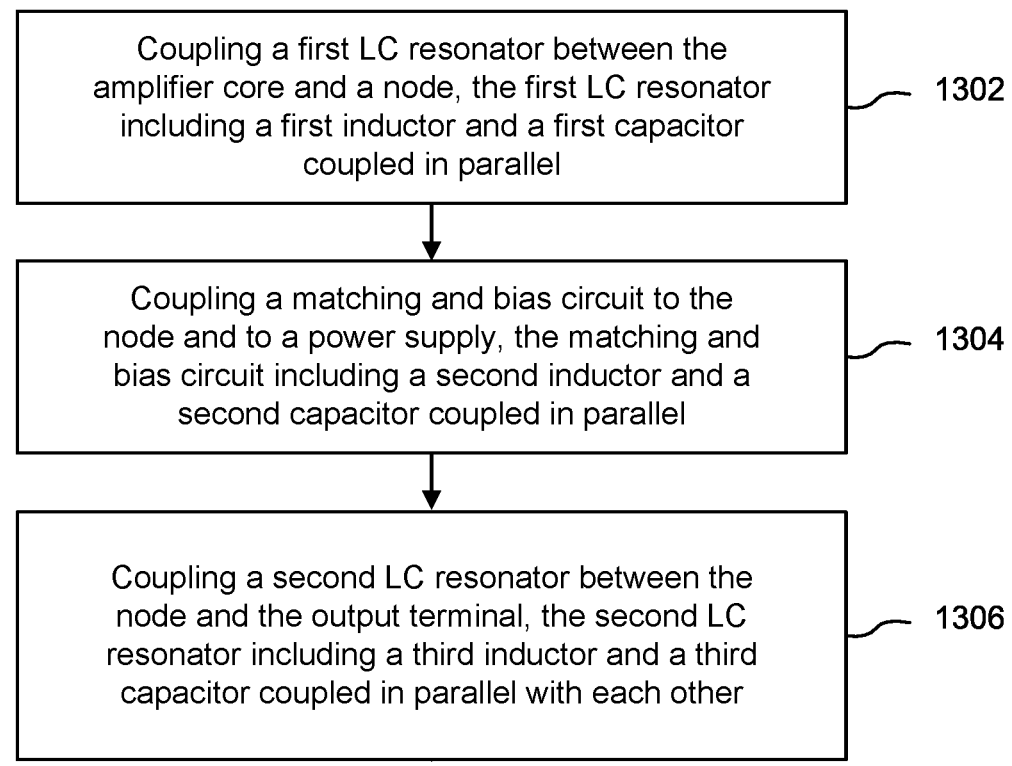
FIG. 13 is a process flow chart showing one method of achieving wideband output impedance matching and high gain for a radio frequency amplifier having an amplifier core and an output terminal.

FIG. 13 is a process flow chart 1300 showing one method of achieving wideband output impedance matching and high gain for a radio frequency amplifier having an amplifier core and an output terminal. The method includes: coupling a first LC resonator between the amplifier core and a node, the first LC resonator including a first inductor and a first capacitor coupled in parallel (BLOCK 1302); coupling a matching and bias circuit to the node and to a power supply, the matching and bias circuit including a second inductor and a second capacitor coupled in parallel (BLOCK 1304); and coupling a second LC resonator between the node and the output terminal, the second LC resonator including a third inductor and a third capacitor coupled in parallel with each other (BLOCK 1306).

Additional aspects of the above method may include modifying the circuit components implementing the method as described above and shown in FIGS. 3A, 4, 6, 7, 8, and 9.

Fabrication Technologies & Options

While the example embodiments shown in FIGS. 3A, 4, 6, 7, and 8 are LNAs, the inventive circuits and methods may also be applied to other types of amplifiers, such as power amplifiers.

Additional well-known circuit elements that might be included in some applications, such as DC block capacitors, additional impedance matching circuitry, and additional filters, are omitted for clarity. Note also that a circuit component that is characterized as "adjustable" may have its value selected from a number of possible component value settings and fixed during fabrication, when assembled in a circuit module, during factory testing, or in the field (e.g., by burning or "blowing" fusible links), or may have its value be dynamically varied, tuned, or programmatically set, such as in response to other circuitry (e.g., temperature compensation and/or power control circuitry) or in response to generated or received command signals.

The modes of operation of the inventive LNA circuits may be set by a control circuit (not shown) in known fashion. The control circuit may also connect to the components that are adjustable to select different component values (e.g., capacitance, resistance, inductance) for different gain states, for example, to help input and/or output impedance matching or vary gain versus linearity in some modes of operation.

The switches shown in embodiments of the present invention may be implemented as FETs, particularly MOSFETs. The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "lower", "upper", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS transistor devices, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A load circuit configured to be coupled between a radio frequency amplifier core and an output terminal, the load circuit including:
   (a) a first LC resonator coupled between the radio frequency amplifier core and a node, the first LC resonator including a first inductor and a first capacitor coupled in parallel;
   (b) a matching and bias circuit coupled to the node and configured to be coupled to a power supply, the matching and bias circuit including a second inductor and a second capacitor coupled in parallel; and
   (c) a second LC resonator coupled between the node and the output terminal, the second LC resonator including a third inductor and a third capacitor coupled in parallel with each other.

2. The load circuit of claim 1, further a fourth capacitor coupled in series with the third inductor and the third capacitor.

3. The load circuit of claim 1, wherein the first LC resonator further includes a bypass switch coupled in parallel with the first inductor and the first capacitor.

4. The load circuit of claim 1, wherein the second LC resonator further includes a bypass switch coupled in parallel with the third inductor and the third capacitor.

5. The load circuit of claim 1, wherein the matching and bias circuit further includes a switch coupled in series with the second capacitor and configured to selectively disable the second capacitor.

6. The load circuit of claim 1, wherein at least one of the first inductor and the first capacitor is adjustable.

7. The load circuit of claim 1, wherein at least one of the third inductor and the third capacitor is adjustable.

8. The load circuit of claim 1, wherein at least one of the second inductor and the second capacitor is adjustable.

9. The load circuit of claim 1, wherein the matching and bias circuit further includes a second resistor coupled in parallel with the second inductor and the second capacitor.

10. The load circuit of claim 9, wherein the second resistor is adjustable.

11. The load circuit of claim 9, wherein the matching and bias circuit further includes a first switch coupled in series with the second resistor and configured to selectively disable the second resistor.

12. The load circuit of claim 9, wherein the first LC resonator further includes a first resistor coupled in parallel with the first inductor and the first capacitor.

13. The load circuit of claim 12, wherein the first LC resonator further includes a second switch coupled in series with the first resistor and configured to selectively disable the first resistor.

14. The load circuit of claim 12, wherein the first resistor is adjustable.

15. A load circuit configured to be coupled between a radio frequency amplifier core and an output terminal, the load circuit including:
   (a) a first inductor coupled between the radio frequency amplifier core and the output terminal;
   (b) a first resistor switchably coupled in parallel with the first inductor between the radio frequency amplifier core and the output terminal;
   (c) a second inductor coupled to the output terminal and configured to be coupled to a power supply;
   (d) a second resistor switchably coupled in parallel with the second inductor and coupled to the output terminal and configured to be coupled to the power supply; and
   (e) a feedback circuit coupled between an input terminal to the radio frequency amplifier core and a feedback node in an output signal path of the radio frequency amplifier core and selectively switchable between enabled and disabled.

16. A load circuit configured to be coupled between a radio frequency amplifier core and an output terminal, the load circuit including:
   (a) a first inductor coupled between the radio frequency amplifier core and a node;
   (b) a first capacitor coupled in parallel with the first inductor;
   (c) a second inductor coupled to the node and configured to be coupled to a power supply;
   (d) a second capacitor coupled in parallel with the second inductor;
   (e) a third inductor coupled between the output terminal and the node;
   (f) a third capacitor coupled in parallel with the third inductor;
   (g) a feedback circuit coupled between an input terminal to the radio frequency amplifier core and a feedback node in an output signal path of the radio frequency amplifier core and selectively switchable between enabled and disabled, wherein the feedback circuit includes a capacitor, a resistor, and switch coupled in series.

* * * * *